(12) United States Patent
Tipton, IV et al.

(10) Patent No.: US 8,546,906 B2
(45) Date of Patent: Oct. 1, 2013

(54) SYSTEM AND METHOD FOR PACKAGING OF HIGH-VOLTAGE SEMICONDUCTOR DEVICES

(75) Inventors: Charles Wesley Tipton, IV, Towson, MD (US); Oladimeji O Ibitayo, Baltimore, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 169 days.

(21) Appl. No.: 13/186,021

(22) Filed: Jul. 19, 2011

(65) Prior Publication Data

US 2013/0020672 A1    Jan. 24, 2013

(51) Int. Cl.
H01L 29/02    (2006.01)

(52) U.S. Cl.
USPC ......................................... 257/487; 257/501

(58) Field of Classification Search
USPC ................................................ 257/487, 501
See application file for complete search history.

(56) References Cited

U.S. PATENT DOCUMENTS

| | | | |
|---|---|---|---|
| 4,563,383 A | 1/1986 | Kuneman et al. | |
| 4,574,162 A | 3/1986 | Kaufman et al. | |
| 5,032,691 A | 7/1991 | Kaufman et al. | |
| 6,362,517 B1 | 3/2002 | Bell et al. | |
| 6,710,463 B2 | 3/2004 | Choi | |
| 6,991,961 B2 | 1/2006 | Hubbard et al. | |
| 2007/0257343 A1 | 11/2007 | Hauenstein et al. | |
| 2013/0020672 A1* | 1/2013 | Tipton et al. | 257/496 |

OTHER PUBLICATIONS

B. J. Baliga, "Power Rectifiers", in Power Semiconductor Devices, Boston, MA, USA, PWS, pp. 182-183, 1995.
J. Wang, et al., "Characterization, Modeling of 10-kV SiC JBS Diodes and Their Application Prospect," IEEE Energy Conversion Congress and Exposition (ECCE), pp. 1488-1493 (2009).
B. A. Hull, et al.,, "Performance and Stability of Large-Area 4H-SiC 10-kV Junction Barrier Schottky Rectifiers," IEEE Trans. Electron Devices, vol. 55, pp. 1864-1870, (2008).
E. R. Motto and M. Yamamoto, "New High Power Semiconductors: High Voltage IGBTs and GCTs," PCIM'98 Power Electronics Conference, Santa Clara, CA, Nov. 713,1998,pp. 296-302.

(Continued)

Primary Examiner — Mark Prenty
(74) Attorney, Agent, or Firm — Lawrence E. Anderson

(57) ABSTRACT

A method and an electronic device structure comprising at least one access lead to adapted to be connected to an electrical circuit; at least one substrate region; at least one semiconductor die positioned on the substrate; the at least one semiconductor die being operatively connected to the at least one access lead; a dielectric region extending below the at least one semiconductor die; the dielectric region being formed by creating a cavity in the at least one substrate region; whereby the dielectric region operates to reduce electric field stresses produced by the at least one semiconductor die to thereby reduce the possibility of material failure and voltage breakdown. The method of making an electronic device structure comprises providing at least one substrate region; providing at least one semiconductor die located on the at least one substrate region; removing a portion of the at least one substrate region to provide a dielectric region within the substrate extending below the at least one semiconductor die; whereby the dielectric region within the at least one substrate region operates to reduce electric field stresses produced by the at least one semiconductor die to thereby reduce the possibility of material failure and voltage breakdown.

20 Claims, 19 Drawing Sheets
(6 of 19 Drawing Sheet(s) Filed in Color)

Simplified Cross Section of Preferred Embodiment HV DBC Structure

(56) References Cited

OTHER PUBLICATIONS

N. S. Nobeen, D. C. Whalley, D. A. Hutt, and B. Haworth, "Computational Modelling of Electrical Field Intensity for High Voltage Semiconductor Package Design," Proceedings of 2010 International Symposium of Advanced Packaging Materials, Cambridge, UK, Feb. 28-Mar. 2, 2010, pp. 54-59.

E. R. Motto, et al., "New High Power Semiconductors: High Voltage IGBTs and GCTs," Power Electronics Conf. (PCIM), Santa Clara, CA, USA, pp. 296-302, (1998).

"KBPC35005 Thru KBPC3510 datasheet," Shanghai Chenyi Electronics Co. Ltd., 2000.

P. H. F. Morshuis, "Degradation of Solid Dielectrics Due to Internal Partial Discharge: Some thoughts on progress made and where to go now," IEEE Trans. Dielectr. Elect. Insul., vol. 12, pp. 905-913, (2005).

G. Mitic and G. Lefranc, "Localization of Electrical-Insulation and Partial-Discharge Failures of IGBT Modules," IEEE Trans. Ind. App/. , vol. 38, No. 1, pp. 175-180, (2002).

Schulz-Harder and K. Exel, "Advanced DBC Substrates for High Power and High Voltage Electronics," Proceeding of 22nd IEEE SEMI-THERM Symposium, Dallas, TX, Mar. 14-16, (2006), pp. 230-231.

R. J. Callanan, et al., "Recent Progress in SiC DMOSFETs and JBS Diodes at Cree," IEEE 34th Industrial Electronics Conf. (IECON), pp. 2885-2890, (2008).

B. A. Hull, et al., "Progress on the Development of 10-kV 4H-SiC PiN Diodes for High Current/High Voltage Power Handling Applications," Mater. Sci. Forum, vol. 556-557, pp. 895-900, (2007).

Diotec Semiconductor: High Voltage Rectifiers form 2kV in SMD to 24 kV in Special Packages, Diotec Semiconductor AG, Heitersheim, Germany, VO1, 2005.

"High Voltage Full Rectifier Assembly-HVFWB Series," HV Component Associates, Dean Technology, Farmingdale, NJ (May 2007).

\* cited by examiner

Conventional FBR Package

Conventional FBR module mounted on copper plate.

Simulated potential of the conventional planar diode-bridge mounted on a solid baseplate.

Cross-sectional view of the simulated electric field intensity of the planar structure with a pocket cut into the baseplate. Equipotential lines are also shown.

Maximum electric field intensity within the aluminum nitride substrate in the B-region as a function of pocket depth (*d*).

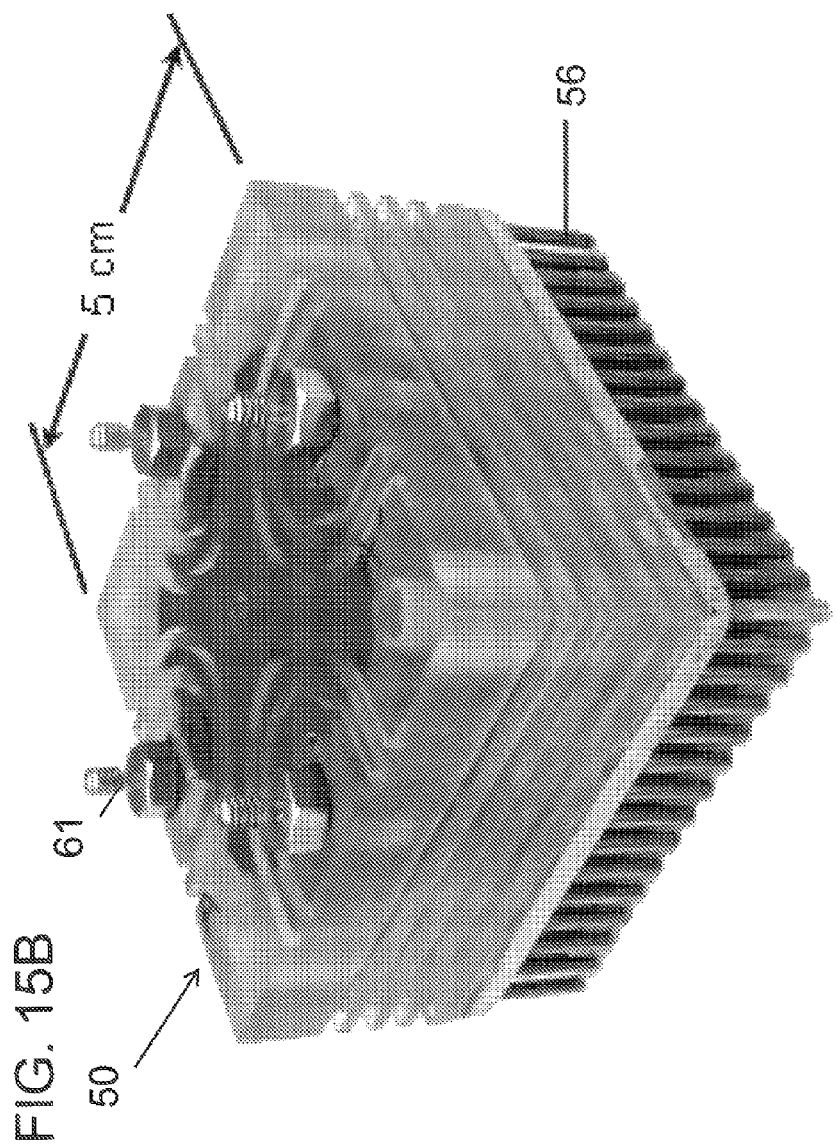

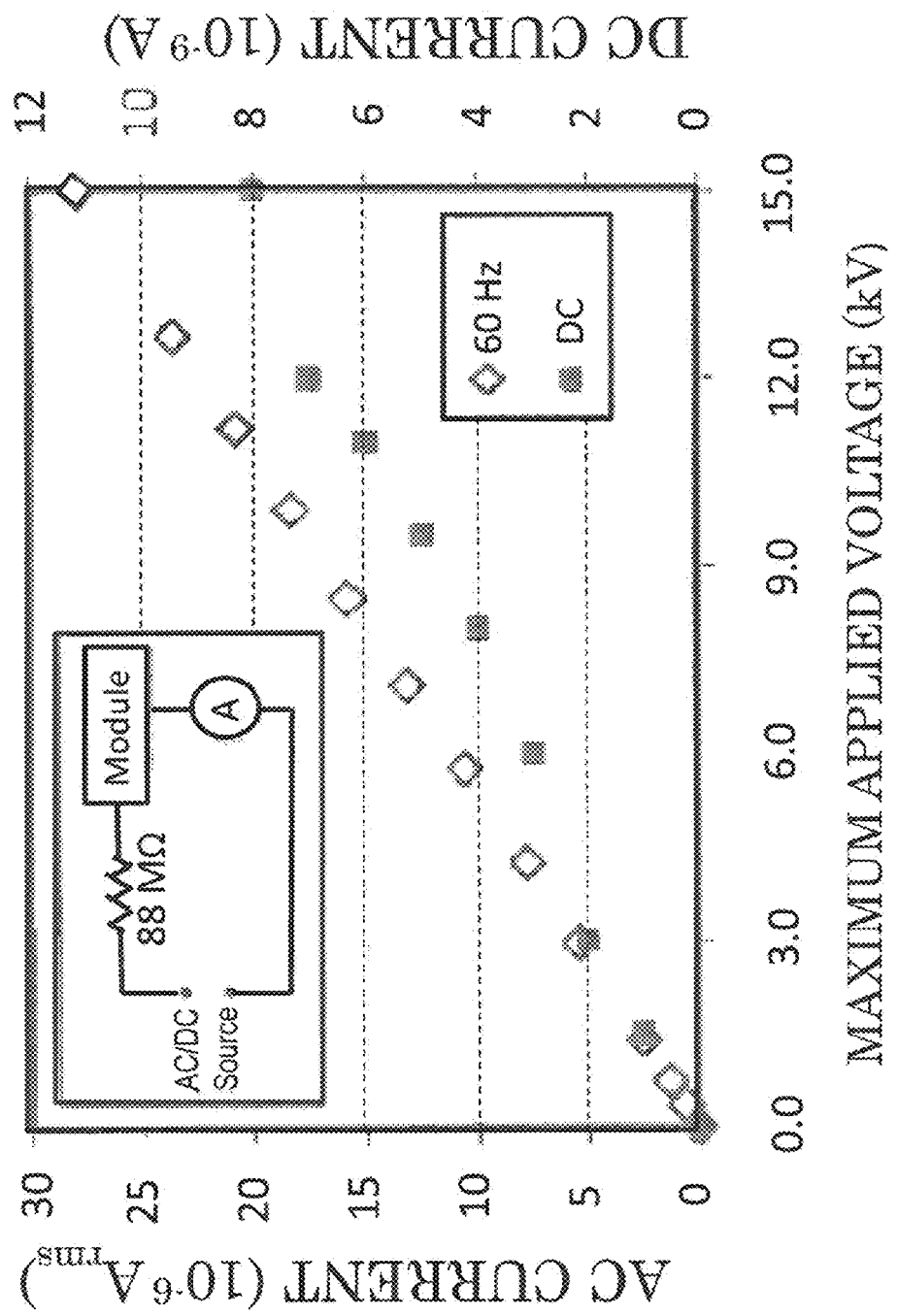
FIG. 16 AC and DC leakage currents of the rectifier module

HV planar rectifier module's simulated thermal performance with each diode dissipating 7.6 W.

HV planar rectifier module's measured thermal performance with each diode dissipating 7.6 W.

SYSTEM AND METHOD FOR PACKAGING OF HIGH-VOLTAGE SEMICONDUCTOR DEVICES

GOVERNMENT INTEREST

The invention described herein may be manufactured, used, and/or licensed by or for the United States Government.

BACKGROUND OF THE INVENTION

Driving factors in modern, high-voltage DC-DC power conversion include size and efficiency. While the maturation of resonant converter circuits and supporting component technologies has decreased the volume of the converters' front-end, the process of inverting high-frequency, high-voltage on the output has not changed significantly over several decades. Designers continue to weigh the trade-off between diode recovery time and reverse breakdown voltage required by silicon devices as discussed further in J. Wang, et al., "Characterization, Modeling of 10-kV SiC JBS Diodes and Their Application Prospect," IEEE Energy Conversion Congress and Exposition (ECCE), pp. 1488-1493 (2009). From a system perspective, one can use high-speed, lower-voltage diodes and a transformer with many secondary windings; lower-speed, high-voltage diodes with fewer secondary windings; or series-connected multiple, high-speed, lower-voltage diodes using a reduced number of secondary windings. In all of these approaches, the output rectifier impacts system size and performance.

Researchers are pushing the bounds of conventional packaging methods and materials to address the needs of high voltage (HV) components. Motto and Yamamoto in "New High Power Semiconductors: High Voltage IGBTs and GCTs" PCIM'98 Power Electronics Conference Proceedings, pp. 296-302, (1998), reported on the development of a 6 kV insulated-gate bipolar transistor module in which the direct bonded copper (DBC) metallization patterns had rounded corners and increased edge margins to reduce electric field intensities. Also, low-pressure processing was used to minimize void creation and decrease associated partial discharge (PD) degradation. PD is usually initiated in gas-filled voids within the dielectric system. Because the dielectric constant of the gas is much less than that of the solid dielectric, the electric field within the void reaches the corona inception voltage of the gas before the solid. The plasma generated within the void, in turn, degrades the surrounding dielectric through chemical and physical attack and ultimately leads to the failure of the dielectric system as described in P. H. F. Morshuis, "Degradation of Solid Dielectrics Due to Internal Partial Discharge: Some thoughts on progress made and where to go now", IEEE Trans. Dielectr. Electr. Insul., Vol. 12, pp. 905-913, (2005).

Partial discharge free, 0.63-mm DBC substrates at electric fields of up to 12 MV/m were reported in Schulz-Harder and K. Exel, "Advanced DBC Substrates for High Power and High Voltage Electronics," Proceeding of 22$^{nd}$ IEEE SEMI-THERM Symposium, Dallas, Tex., Mar. 14-16, 2006, pp. 230-231. With the maturation of wide band-gap semiconductor materials, however, single die can now achieve breakdown voltages in excess of 10 kV, as reported in R. J. Callanan, et al., "Recent Progress in SiC DMOSFETs and JBS Diodes at CREE," Proceedings of 34th IEEE Industrial Electronics Conf., Orlando, Fla., Nov. 10-13, 2008, pp. 2885-2890. These components require new methods and materials to realize their full benefit.

The development of high-voltage (HV) components has been accelerated with recent advances in the material quality of the semiconductor silicon carbide (SiC) as described in J. Wang, et al., "Characterization, Modeling of 10 kV SiC JBS Diodes and Their Application Prospect," IEEE Energy Conversion Congress and Exposition, 2009; pp. 1488-1493, 20-24 September 2009 and B. A. Hull, et al., "Performance and Stability of Large-Area 4H—SiC 10-kV Junction Barrier Schottky Rectifiers," IEEE Trans. Electron Devices, vol. 55, pp. 1864-1870, August 2008. However, there have been relatively few reports of packaging advances that support the use of components operating above 6 kV.

A schematic of a full bridge rectifier (FBR) circuit 10 is shown in FIG. 1, including terminals 14. In the FBR, four diodes are interconnected, as shown in FIG. 1, to transform (rectify) the bipolar electrical signal applied to the AC terminals (14AC) to a unipolar signal at the positive (+) and negative (−) terminals 14. FIG. 2 illustrates the conventional approach to packaging a high voltage (HV) full bridge rectifier (FBR) 10A. The case is constructed from a high-temperature plastic with four terminals 14. The diode die are connected to the terminals and positioned within the plastic case. The case is then filled with an epoxy- or silicone-based encapsulant, which provides mechanical support. The module is designed so that the packaging materials electrically isolate the internal diode structure from its surroundings. To ensure reliable operation, the manufacturer specifies the maximum voltage isolation between the module and mounting surface, which is opposite the terminals. In this packaging approach, however, there is high thermal resistance between the diodes and external heat-conducting bodies. Heat generated within the diodes is not effectively transmitted out of the package. For this reason, the current rating of the FBR must be significantly de-rated, with respect to the capability of the diodes, to avoid failure. Typically, operational current de-rating begins at case temperatures of approximately 55° C. and can be reduced by 100% at 175° C., as described in "KBPC35005 Thru KBPC3510 datasheet," Shanghai Chenyi Electronics Co. Ltd., (2000).

There are several finite element analysis tools that are used to solve three-dimensional heat transfer problems. The baseline thermal performance of the conventional full bridge rectifier (FBR) was obtained using the computational fluid dynamics program SolidWorks® Flow Simulation by Dassault Systemes Solid Works Corp., and accepted material properties and power loss estimates. FIG. 3A illustrates the simulation model of the conventional FBR with four diodes 15 suspended within the encapsulation and mounted on a copper plate. Each diode dissipates 8 W and the ambient temperature is 20° C. FIG. 3B shows the steady-state thermal profile where the diode and baseplate temperatures reach approximately 209° C. and 69° C., respectively. As noted previously, silicon diodes are operated below 175° C. (and more often below 125° C.) because of high-temperature performance degradation. A diode temperature of 209° C. is clearly not acceptable, and a packaging scheme with lower thermal resistance is needed to better utilize the semiconductor devices in this scheme. In the following sections, these results will be compared with another commercial approach and the embodiments of the present invention.

In addition to the thermal aspects of packaging design, deterioration of the packaging materials due to electric field stress must also be considered. Partial or corona discharge within electrical insulation systems is a deteriorating mechanism in HV packaging as reference in P. H. F. Morshuis, "Degradation of Solid Dielectrics Due to Internal Partial Discharge: Some thoughts on progress made and where to go now," *IEEE Trans. Dielectr. Electr. Insul.*, vol. 12, pp. 905-913, October 2005. The dielectric strengths of the materials determine the maximum electric field that can be supported before these materials become conductive (dielectric breakdown). In practice, however, the maximum useable dielectric strength is much less than theoretical values. Partial discharge (PD) is usually initiated in gas-filled voids within the dielectric system. Because the dielectric constant of the gas is much less than that of the solid dielectric, the electric field within the void reaches the corona inception voltage of the gas before the solid. The plasma generated within the void, in turn, degrades the surrounding dielectric and ultimately leads to failure of the electrical isolation system. To ameliorate partial discharge (PD) degradation, electric fields should be minimized by increasing the spacing between HV conductors and by eliminating sharp edges or points on conductors that act as electric field concentrators.

In U.S. Pat. No. 4,563,383 to Kuneman and Dickson entitled "Direct Bond Copper Ceramic Substrate for Electronic Applications," discloses a multilayered direct-bond copper (DBC) substrates for electronics packaging. Widely used in modem electronics, the typical embodiment consists of a sheet ceramic, usually aluminum nitride (AlN) or aluminum oxide, clad on both sides by a thin layer of copper. The DBC structure allows for higher-density packaging through improved heat transfer and electrical isolation of components mounted to the copper layers.

A top view of a planar DBC-based full bridge FBR 20 is shown in FIG. 4. As used herein, the terminology "planar" refers to die mounted on a ridged, metalized substrate. In this figure, the lighter regions represent ceramic 21, the gray regions represent the diode die 22, and the intermediate regions are top metal pads 23 operatively connected to terminals 24. Note that the diode die 22 are also multilayered structures in that their top and bottom surfaces are the anodes and cathodes, respectively. The DBC substrate is patterned with four pads for the diode die and terminals. One pad is large enough to provide the electrical interconnection of two diodes (cathodes), whereas bond wires are used to make all other connections. The overlaid electrical schematic shows the diode interconnections, some of which have not been included in the simulation model.

FIG. 5 shows a simplified cross-sectional view of the FBR 20 illustrated in FIG. 4 taken along the line A-A'. Each semiconductor die 22 (comprising an anode 26 made of Al and a silicon (or silicon carbide) layer 31, is mechanically and electrically connected to the substrate by a thin layer of solder 28 as shown in FIG. 5. Layer 23 is generally formed of copper. Since the copper layers may be patterned, an entire circuit consisting of passive components, such as resistors and capacitors, as well as semiconductor devices may be constructed, Similarly, the substrate 29 is attached to the baseplate 27 by a solder layer 25. The ceramic layer 21 (which may be for example aluminum nitride (AlN) or aluminum oxide) provides electrical isolation between the circuit and the baseplate 27. In a typical application, such as a 1200 V insulated gate bipolar transistor module, the die 22 are soldered to the top DBC layer and a baseplate 27 is soldered (by solder 25) to the bottom DBC layer 32 (Cu) as illustrated in FIG. Assuming a baseplate isolation voltage of approximately 2500 V, and using readily available materials, this structure is relatively robust from an electrical reliability perspective and has relatively good thermal performance.

Relative to the conventional high voltage (HV) FBR of FIGS. 2, 3A and 3B previously described, the planar structure provides a lower thermal resistance path from the semiconductor die to the baseplate. This enables the components to be operated at higher baseplate temperatures or higher power dissipations without the penalty of significant electrical performance derating. FIG. 6 shows the simulated die temperature of a planer DBC structure using the same material and loss parameters of the conventional package simulation. Here, the maximum die temperature of the planar package is approximately 67° C. or three times lower than that of the conventional package. Note that there is only a 3° C. temperature difference between the diode and baseplate. This is believed to be due to the higher thermal conductivity of ceramics (approximately 180 W/m·K for AlN) versus that of the organic encapsulants (approximately 1 W/m·K) and the shorter distance between the diode and ambient.

Since the ceramic layer also provides electrical isolation of the circuit from the baseplate, it must be thick enough to withstand the applied voltages. Bulk AlN has a typical breakdown voltage range of 12-17 MV/m. Therefore, to provide the commercial and industrial isolation voltage of approximately 2.5 kV, a 210 µm layer of AlN is required. It is recognized, however, that one of the impediments of using direct bonded copper (DBC) in high voltage (HV) packaging is the onset of PD at approximately 60% of the dielectric strength of the bulk ceramic. This behavior is attributed to voids between the copper and ceramic, irregularities on the etched copper/ceramic interface, and solder residues. For a further description, see G. Mitic and G. Lefranc, "Localization of Electrical-Insulation and Partial-Discharge Failures of IGBT Modules," *IEEE Trans. Ind. Appl*, vol. 38, no. 1, pp. 175-180 (2002) and Schulz-Harder and K. Exel, "Advanced DBC Substrates for High Power and High Voltage Electronics," Proceeding of 22nd IEEE SEMI-THERM Symposium, Dallas, Tex., Mar. 14-16, 2006, pp. 230-231. For example, PD in AlN DBC has been reported at fields of 7 MV/m. Because of manufacturing issues (mechanical stress), 254 µm is usually the minimum AlN thickness commonly used in packaging, while 500 µm is the maximum thickness. At 500 µm, the voltage difference between the semiconductor die and baseplate should not exceed approximately 3.5 kV in order to avoid long-term failure modes.

It is noted that in U.S. Patent Application Publication 20070257343 to M. Hauenstein, et al., entitled "Die-on-Leadframe (DOL) with High Voltage Isolation," there is proposed an alternative packaging approach to improve thermal performance and provide dielectric isolation by employing a thin curable insulation layer to replace the ceramic substrate. Although the thin organic layer provides lower mechanical stress, it cannot support high voltage (HV) isolation. Furthermore, the long-term reliability issue of partial discharge (PD) within the insulation layer was not addressed. Likewise, in U.S. Pat. No. 6,991,961 to R. L. Hubbard, et al, entitled "Method of Forming a High-Voltage/High-Power Die Package," there is proposed a flexible packaging scheme for power components operating at <2 kV but without consideration of thermal or reliability issues.

SUMMARY OF THE INVENTION

A preferred embodiment of the present invention comprises a method and apparatus for compact high voltage (HV) packaging of semiconductor circuitry. Semiconductor devices, such as transistors and diodes, are often co-packaged in multiple arrangements to increase current and/or voltage ratings or to realize a specific function. One such function is the full-bridge rectifier (FBR), a schematic of which is shown in FIG. 1. As an example of a preferred embodiment, the full-bridge rectifier (FBR) circuit is used to describe implementation of facets of the proposed invention.

A preferred embodiment of the present invention comprises a novel packaging technique that enables the compact integration of state-of-the-art HV semiconductor devices. To realize the improved thermal performance of the planar packaging scheme with HV (>6-kV) die, electric fields must be mitigated in the ceramic portion of the substrate or substrates. To reduce the electric fields within the substrate(s) or substrate region(s), a preferred embodiment, as illustrated in FIG. 9, comprises a pocket 47 which may be cut in the metal baseplate 46 and the bottom direct bonded copper (DBC) layer 45. This "pocket" region is a dielectric region and may be filled with the ambient gas such as air, a liquid such as mineral oil, or a solid such as silicone, for example. The pocket may be patterned, for example, as shown in FIG. 9. The pocket depth (d), pad margin (w), and pad spacing (s) are adjusted to reduce electric field intensities. As an example, d=1.8 mm and w=s=2 mm. There are two regions of interest in this geometry: regions directly under the diode mounting pads ("A-regions") and the inter-diode regions where there is no top metallization ("B-regions"). The maximum electric field in the A-regions is approximately 1.2 MV/m (a 92% reduction over the solid baseplate case), which is well below the partial discharge (PD) threshold of 7 MV/m. In the B-region, the maximum field intensity is approximately 8 MV/m. As the pocket depth is increased, the magnitude of the electric field in the B-regions decreases, as shown in FIG. 11. In this example, increasing the pocket depth more than 1 mm does not significantly reduce the electric field in these regions. The electric field intensity in the B-regions is, however, a strong function of the lateral separation and potential of the top metallization pads. This leads to a design trade-off between overall package size and component reliability. For the example design, FIG. 12 shows the dependence of electric field intensity within the AlN layer, as spacing s is varied from 0.5 to 4 mm with an applied potential difference of 15 kV. By increasing the pad spacing to 2 to 3 mm, one may operate below the PD threshold.

An aspect of the present invention is to effectively increase the dielectric strength of the substrate region under the die by introducing the dielectric region which is generally contiguous with the substrate region. The thickness of the substrate region (0.4 to 2 mm) and thickness of the dielectric region (0.2 to 4 mm) add to increase the distance between conducting surfaces thereby reducing the electric field (megavolts per meter) under the die. The dielectric region may be formed from dielectric materials which operate to increase the breakdown strength. Because DBC ceramic is generally only available up to thicknesses of 1 mm, the reduction of electric field required to quench partial discharge degradation usually not possible using only DBC. Furthermore, thick layers of DBC will have high thermal resistance which will reduce heat spreading and increase the temperature of the die. Therefore, the thicknesses of the dielectric and ceramic regions are critical parameters in the design of the present invention.

A preferred method of making an electronic device structure comprises providing at least one substrate region and providing at least one semiconductor die located on the at least one substrate region. Either (1) a portion of the at least one substrate region may be removed to provide a dielectric region within the at least one substrate region extending below the at least one semiconductor die; or (2) the at least one substrate may be produced or manufactured with a portion of the at least one substrate region comprising a dielectric region. The result produces a dielectric region which operates to reduce electric field stresses produced by the at least one semiconductor die to thereby reduce the possibility of material failure and voltage breakdown. For example, when using a direct bonded copper, direct bonded aluminum, or direct plated copper substrate in combination with a base plate comprising a metallic material, a capacitive effect is produced between the base plate and one of the direct bonded copper, direct bonded aluminum, or direct plated copper substrate region. Consequently, when a portion of the base region is removed to form the dielectric region, this operates to increase the distance between the resultant base plate and one of the direct bonded copper, direct bonded aluminum, or direct plated copper substrate. Of particular concern is the area underneath each of the semiconductor die. The preferred embodiment creates a dielectric region substantially underneath each of the semiconductor die while maintaining the mechanical strength in other areas.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention can best be understood when reading the following specification with reference to the accompanying drawings, which are incorporated in and form a part of the specification, illustrate alternate embodiments of the present invention, and together with the description, serve to explain the principles of the invention. In the drawings:

FIG. 15B is an illustration a preferred embodiment 15-kV planar FBR completed module.

FIG. 16 illustrates AC and DC leakage currents of a mock-up preferred embodiment rectifier module.

DETAILED DESCRIPTION OF THE PREFERRED EMBODIMENTS

Figure 1:
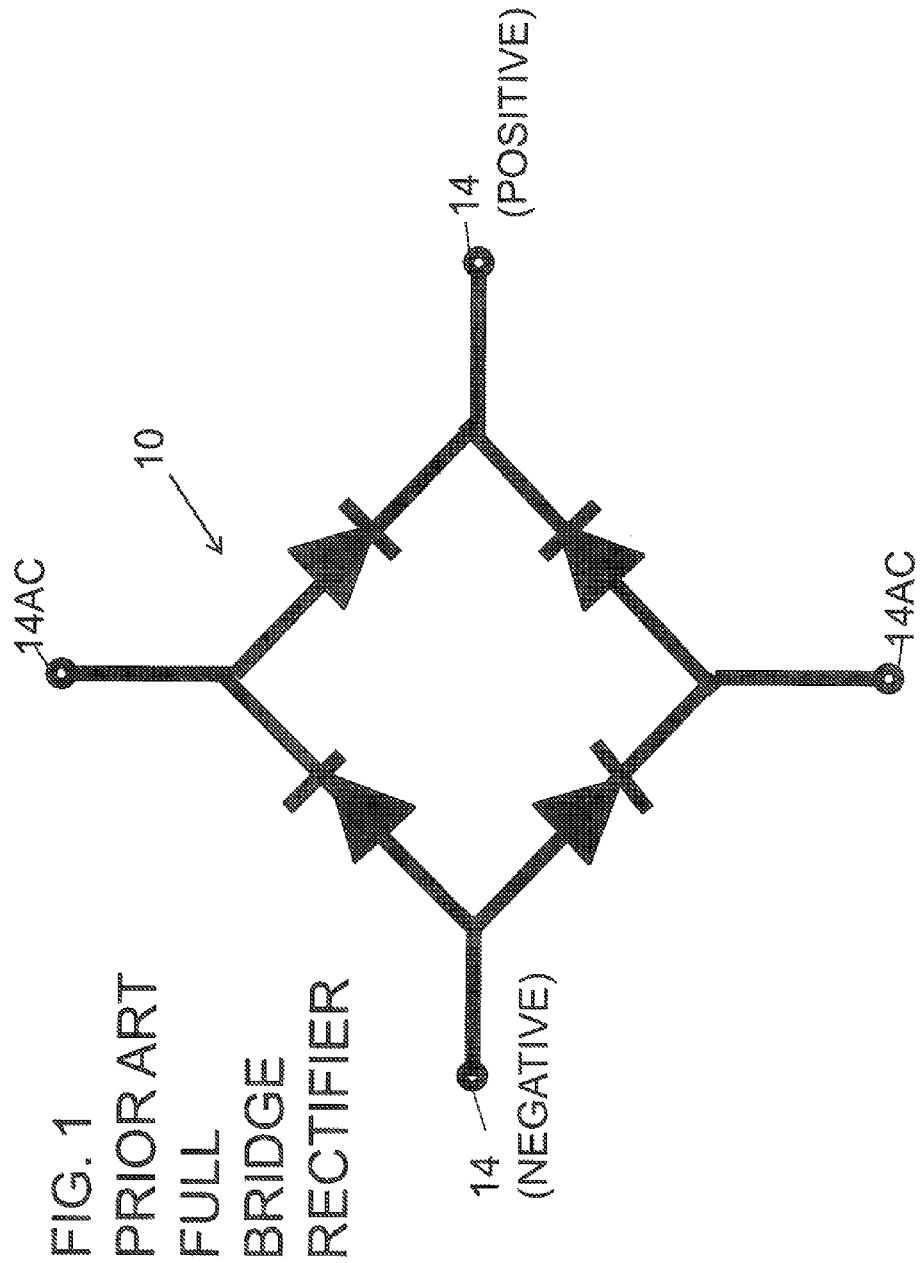
FIG. 1 is a schematic illustration of a conventional full-bridge diode rectifier (FBR) with four terminals for electrical connections.
Figure 2:
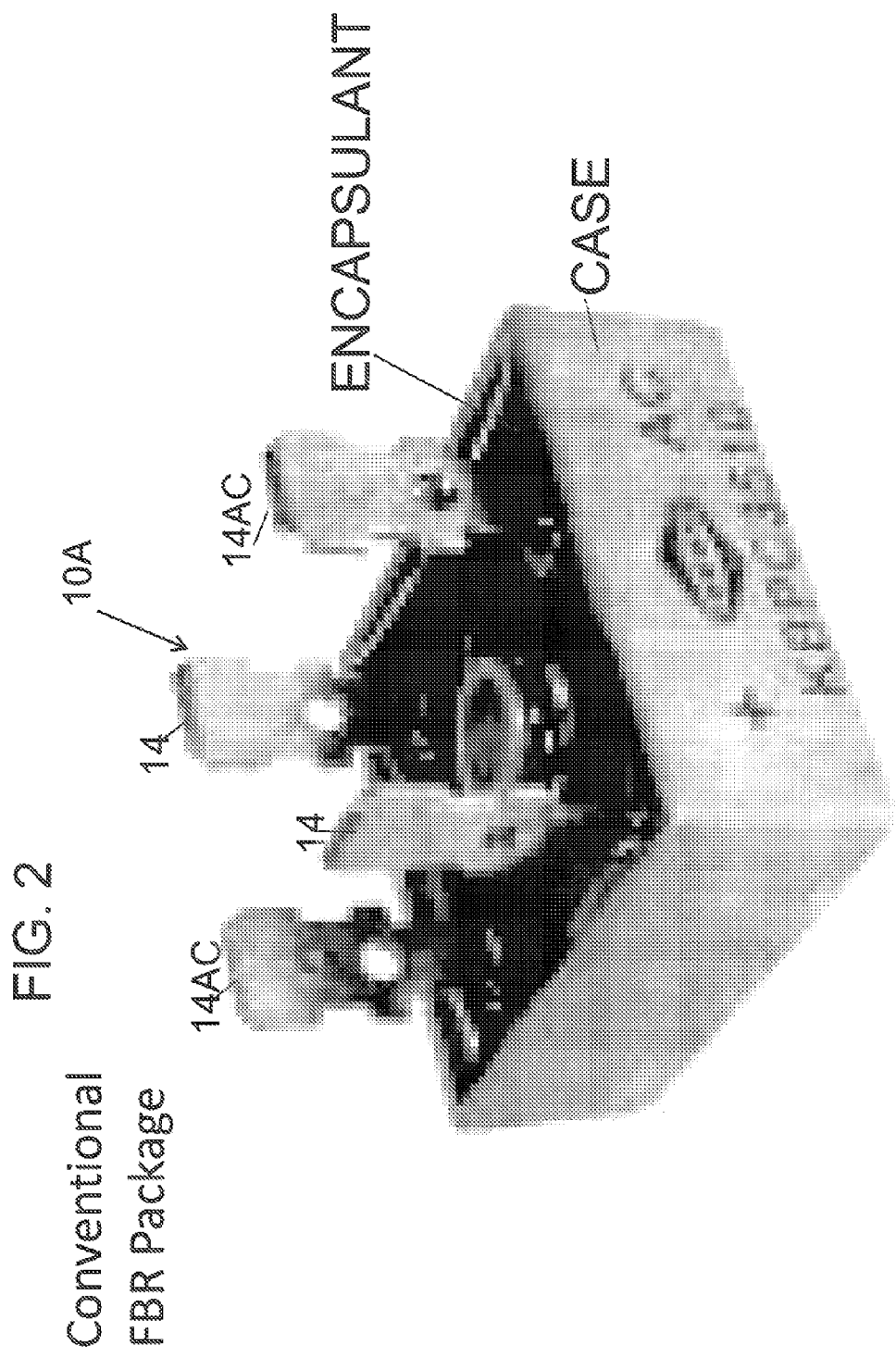
FIG. 2 illustrates an example for the conventional packaging of a high voltage (HV) FBR full bridge rectifier.
Figure 3B:
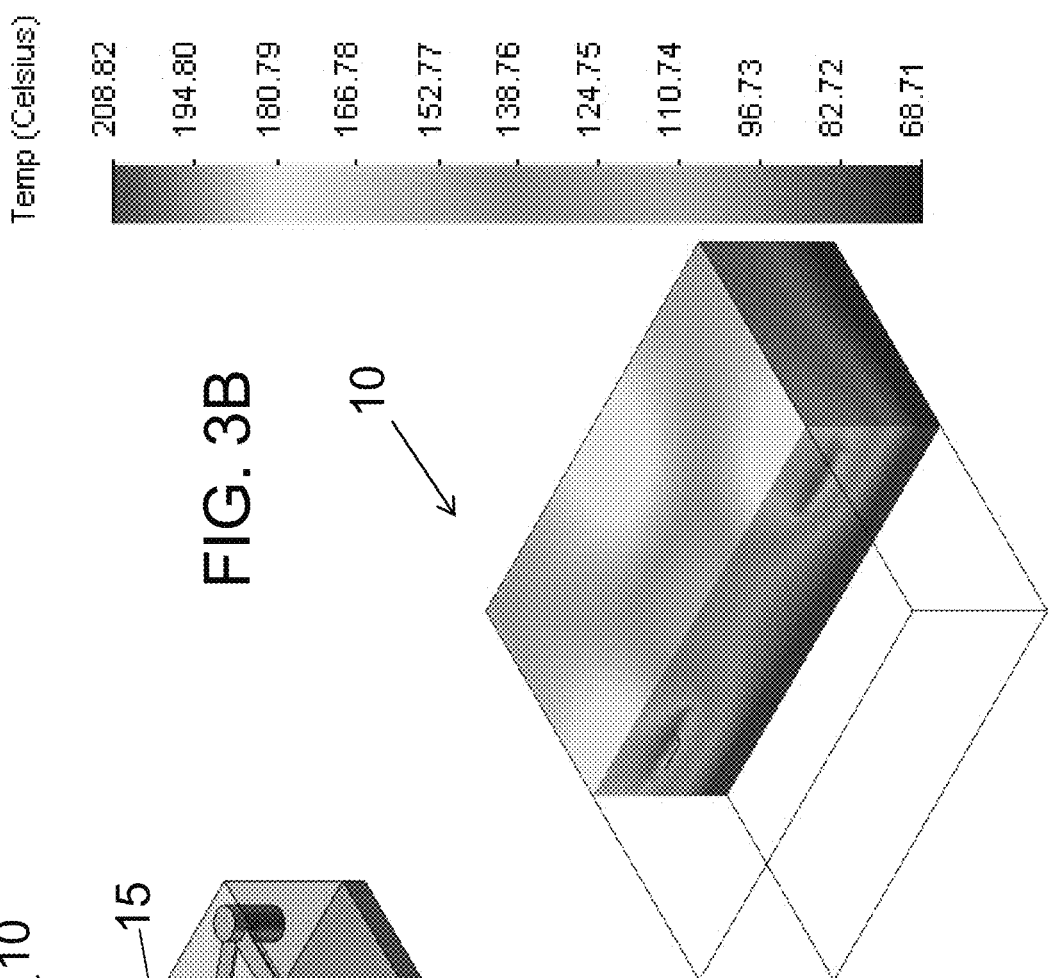
FIG. 3B illustrates a steady-state thermal profile with 8 W per diode at 20° C. ambient environment for a conventional full bridge rectifier module mounted on copper plate.
Figure 3A:
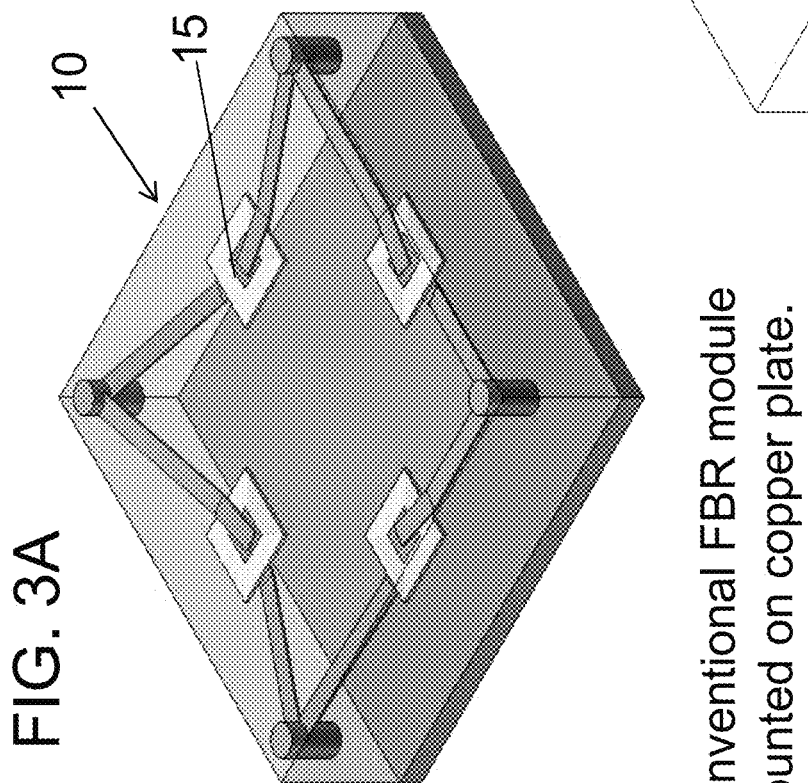
FIG. 3A illustrates the simulation model of the conventional FBR with four diodes suspended within the encapsulation and mounted on a copper plate.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further-understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" or "extending over" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. The terminology "extending on" or "extending over" can, therefore, encompass both an orientation "over" or "under" depending upon the orientation of the Figure or structure. The terminology "extending below" can, therefore, encompass both an orientation "below" or "over" depending upon the orientation of the Figure or structure. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

It will also be appreciated by those of skill in the art that references to a structure or feature that is disposed "adjacent" another feature may have portions that overlap or underlie the adjacent feature.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

With the advent of improved silicon carbide (SiC) material, high-voltage (10 kV) junction-barrier Schottky (JBS) diodes have been demonstrated as referenced in R. J. Callanan, et al, "Recent Progress in SiC DMOSFETs and JBS Diodes at Cree", IEEE 34th Industrial Electronics Conf. (IECON), pp. 2885-2890 (2008), and higher voltages have become feasible. Under American Recovery and Reinvestment Act funding, CREE Inc. has developed a 15 kV, 3 A SiC JBS diode for power conversion applications. The JBS diode has a gridded junction structure that suppresses leakage current under reverse bias. By independently reducing the leakage current, the Schottky barrier height may be lowered, thereby reducing the forward voltage drop, as described further in B. J. Baliga, "Power Rectifiers", in Power Semiconductor Devices, Boston, Mass., USA, PWS, pp. 182-183 (1995). Additionally, the JBS diode is a majority carrier device and does not suffer from stored charge effects that also increase power dissipation. These attributes make the JBS diode a very efficient device for high-frequency power electronics.

An object of such work was to package the 15 kV JBS diodes as a compact, full-bridge rectifier (FBR) module suitable for prototype converter demonstrations. Each leg of the bridge contains only one diode die; therefore, voltage equalization components found in series-stacked diodes are not needed. The module was to be fabricated using conventional materials and construction techniques, and employ convective cooling. In the following, an overview of the characteristics of the first production lot of the diodes, considerations of high-voltage packaging, and results of electrostatic and thermal analyses of the prototype package and its novel features. Also discussed is the practical implementation of the full-bridge module and characterization results obtained.

Figure 7A:
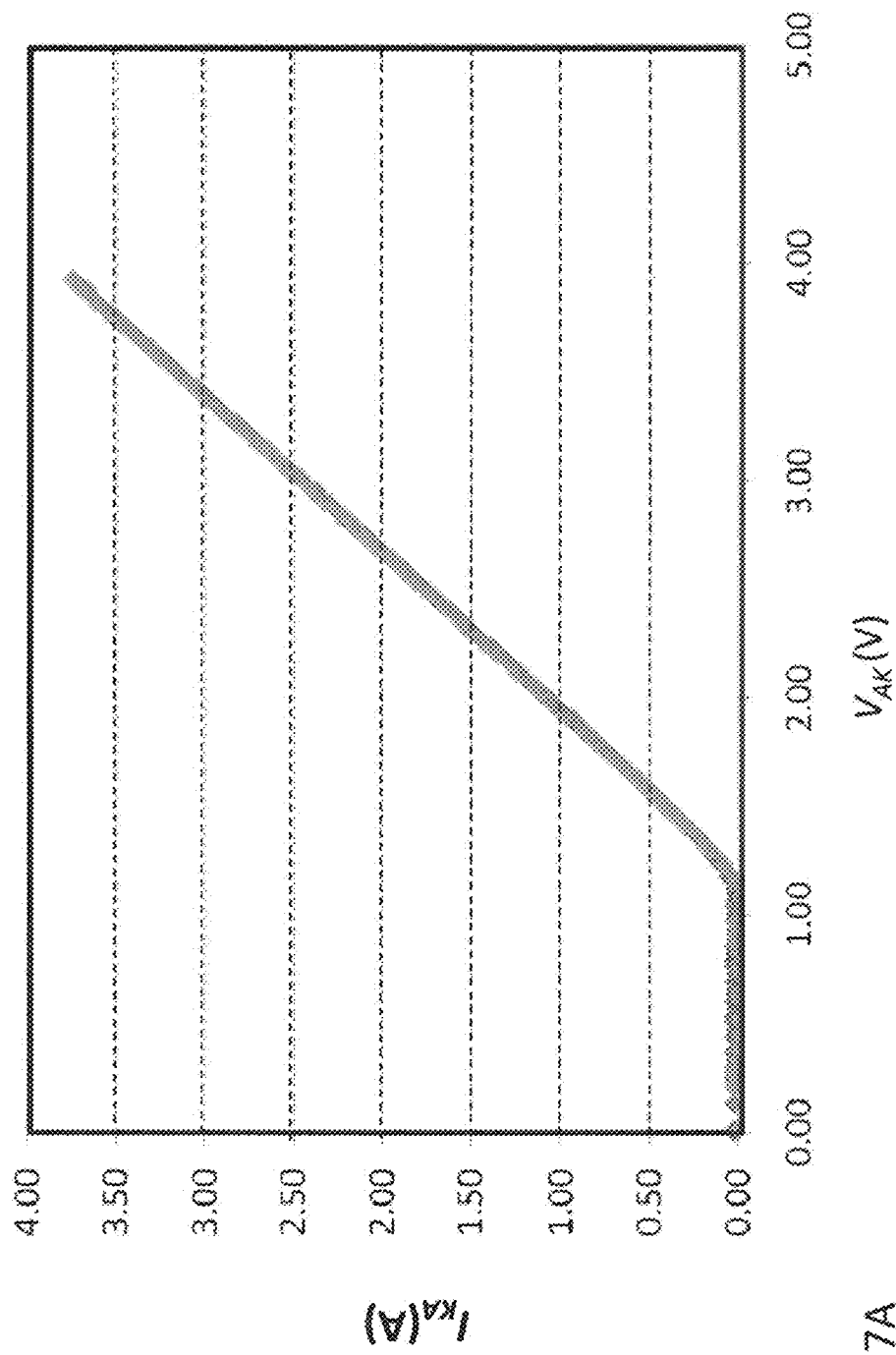
FIG. 7A is graphical illustration of the forward conduction characteristics of a 15 kV SiC JBS diode at 25° C.
Figure 7B:
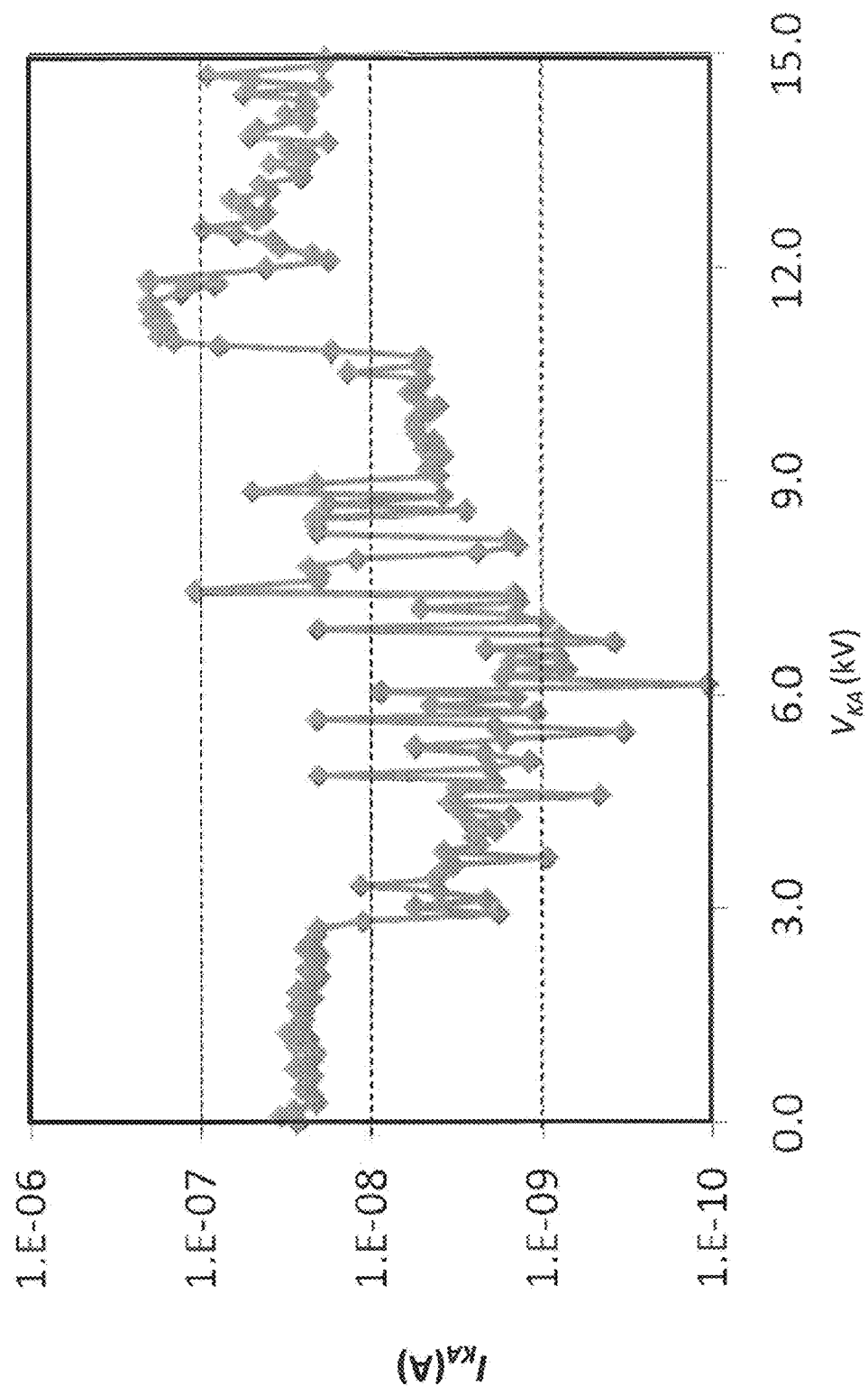
FIG. 7B is graphical illustration of the reverse blocking characteristics of a 15 kV SiC JBS diode at 25° C.

Diodes used were developed by CREE Inc. and are the latest in a progression of high-voltage SiC diodes. In 2007, CREE developed a 10 kV, 20 A JBS diode under the Defense Advanced Research Projects Agency's Wide Bandgap Semiconductor Technology Initiative as referenced in B. A. Hull, et al. "Progress on the Development of 10-kV 4H—SiC PiN Diodes for High Current/High Voltage Power Handling Applications", *Mater. Sci. Forum*, Vol. 556-557, pp. 895-900 (2007) and B. A. Hull, et al., "Performance and Stability of Large-Area 4H—SiC 10-kV Junction Barrier Schottky Rectifiers," *IEEE Trans. Electron Devices*, Vol. 55, pp. 1864-1870, (2008). This device was intended to be used as a freewheeling diode when paired with a 10 kV SiC metal-oxide-semiconductor field-effect transistor in a half-bridge module. The 2007 diodes served as a basis for the present devices, with modifications to the starting material and field termination structure. The diodes in this work have been designed for the full-bridge rectifier (FBR) in a 150 kHz resonant DC-DC converter with a nominal output voltage of 10 kV. The die dimensions are 8 mm×8 mm and are rated for approximately 3 A. The ratio of active conduction area to total die area is 0.39. FIG. 7A shows the forward conduction characteristics of a typical diode that has a forward voltage of 3.4 V at 3 A and 25° C. To provide an operating margin, these diodes were designed to have a nominal reverse blocking voltage of 15 kV. The reverse bias leakage current characteristic is given in FIG. 7B. Both forward and reverse characteristics were taken on unpackaged die using a probe station and Fluorinert™ bath. The variability in the leakage current data is attributed to, in part, the measurement apparatus. Diodes for this module were selected based on the following criteria: (1) forward voltage-drop-of-less than or equal to 4 V at room temperature at a forward current of 3 A (12 A/cm2, normalized to conduction area) and (2) reverse leakage current was less than 10 µA (16 µA/cm2, normalized to die area) at 13 kV. Because of measurement uncertainty and device yield, the breakdown acceptance criteria was reduced from 15 kV to 13 kV for the proof-of-concept module, which reduced the operating margin of the converter but does not impact the package design.

There has been limited reporting of package development for components rated greater than 6 kV operation. The development of a 6 kV insulated-gate bipolar transistor module in which the direct-bonded copper (DBC) metallization patterns had rounded corners, and increased edge margins were employed to reduce electric field intensity is reported in E. R. Motto and M. Yamamoto, "New High Power Semiconductors: High Voltage IGBTs and GCTs", Power Electronics Conf. (PCIM), Santa Clara, Calif., USA, pp. 296-302 (1998) Also, low-pressure processing was used to minimize void creation and associated partial discharge (PD) degradation. PD is usually initiated in gas-filled voids within the dielectric system. Because the dielectric constant of the gas is much less than that of the solid dielectric, the electric field within the void reaches the corona inception voltage of the gas before the solid. The plasma generated within the void, in turn, degrades the surrounding dielectric through chemical and physical attack and ultimately leads to the failure of the dielectric system as reported in P. H. F. Morshuis, "Degradation of Solid Dielectrics Due to Internal Partial Discharge: Some thoughts on progress made and where to go now", IEEE Trans. Dielectr. Electr. Insul., Vol. 12, pp. 905-913, (2005). J. Schulz-Harder and K. Exel, "Advanced DBC Substrates for High Power and High Voltage Electronics", IEEE 22nd SEMI-THERM Symposium, Dallas, Tex., USA, pp. 230-231 (2006) reported 0.63 mm DBC substrates at electric fields of up to 12 MV/m.

With the continued maturation of wide band-gap semiconductor materials such as silicon carbide, single die can now achieve breakdown voltages in excess of 10 kV. This is now stimulating research in new methods and materials for high-voltage packaging. In the following sections, preferred embodiments will be discussed that enable compact integration of state-of-the-art high-voltage components.

Figure 4:
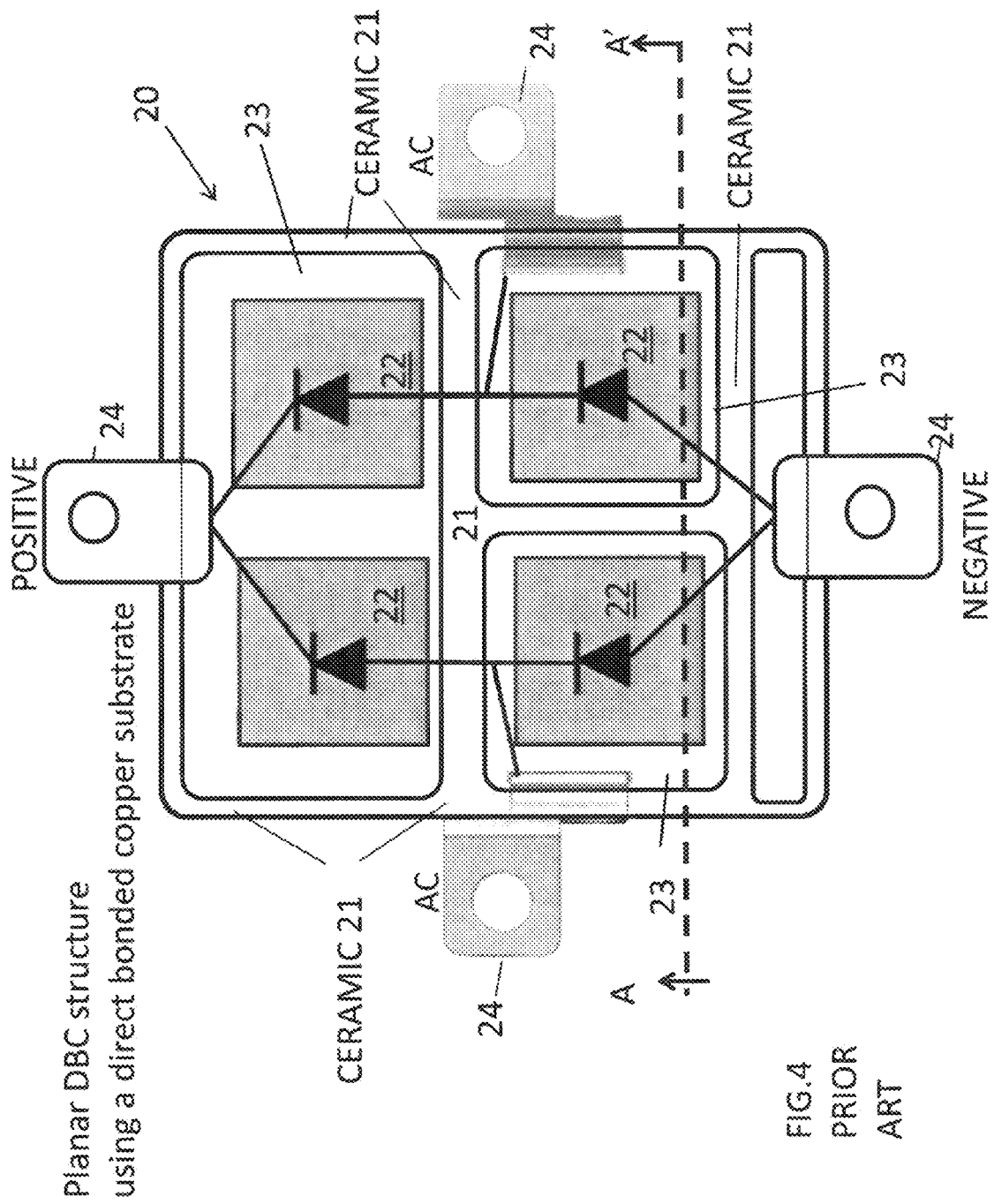
FIG. 4 illustrates a simplified cross-sectional view of a DBC structure 20 used in semiconductor packaging.
Figure 5:
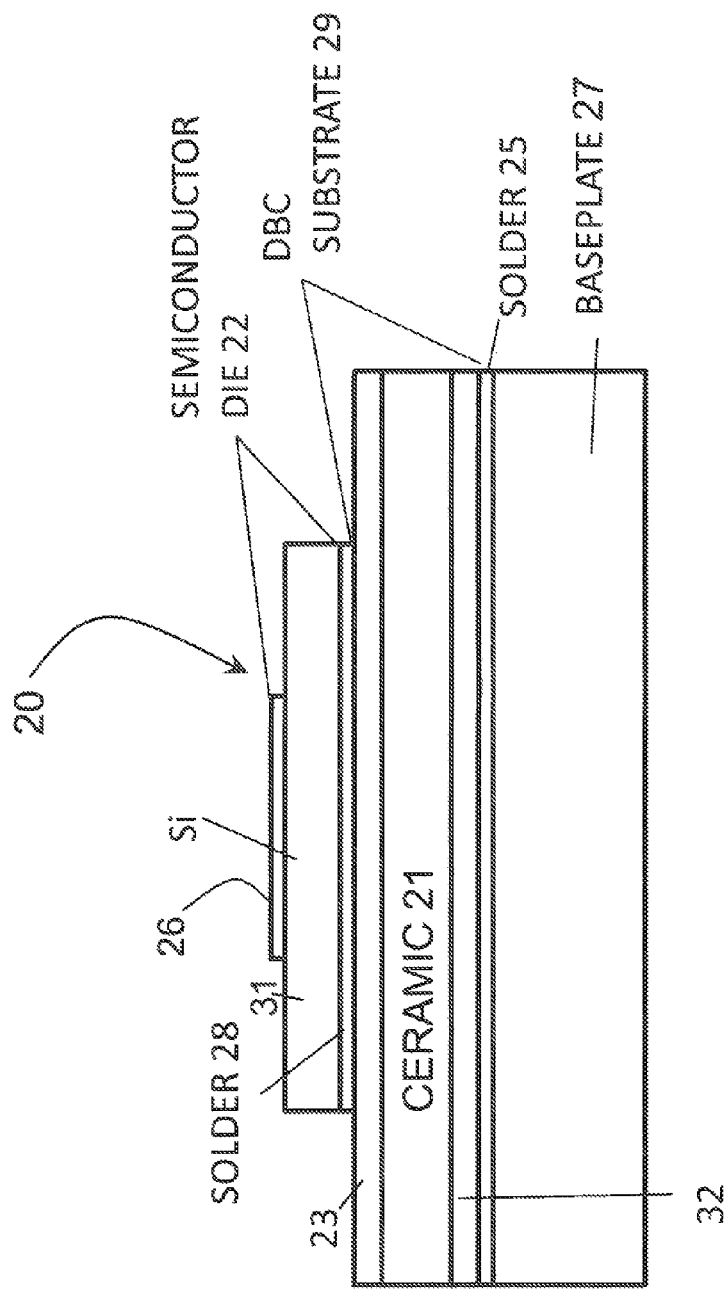
FIG. 5 illustrates a planar full bridge rectifier using a direct bonded copper substrate.
Figure 8A:
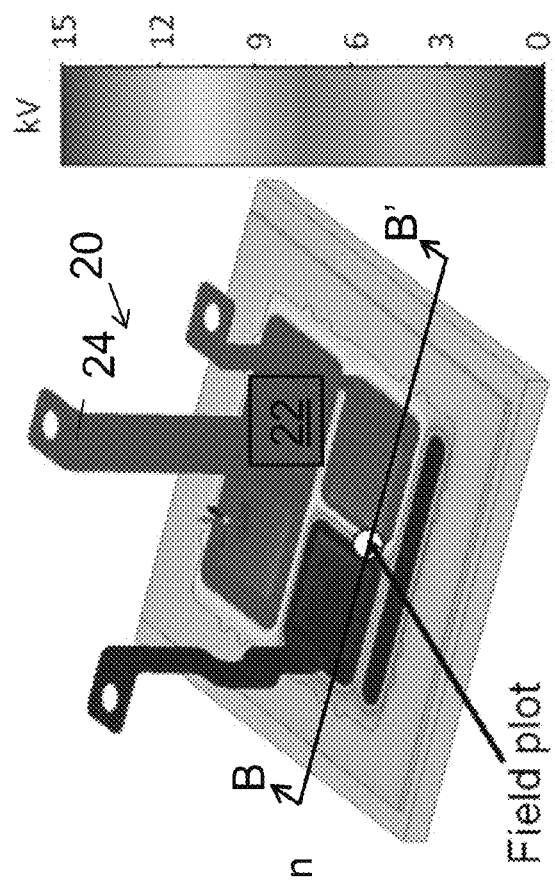
FIG. 8A is the simulated, potential distribution of the conventional planar diode bridge with solid baseplate.
Figure 8B:
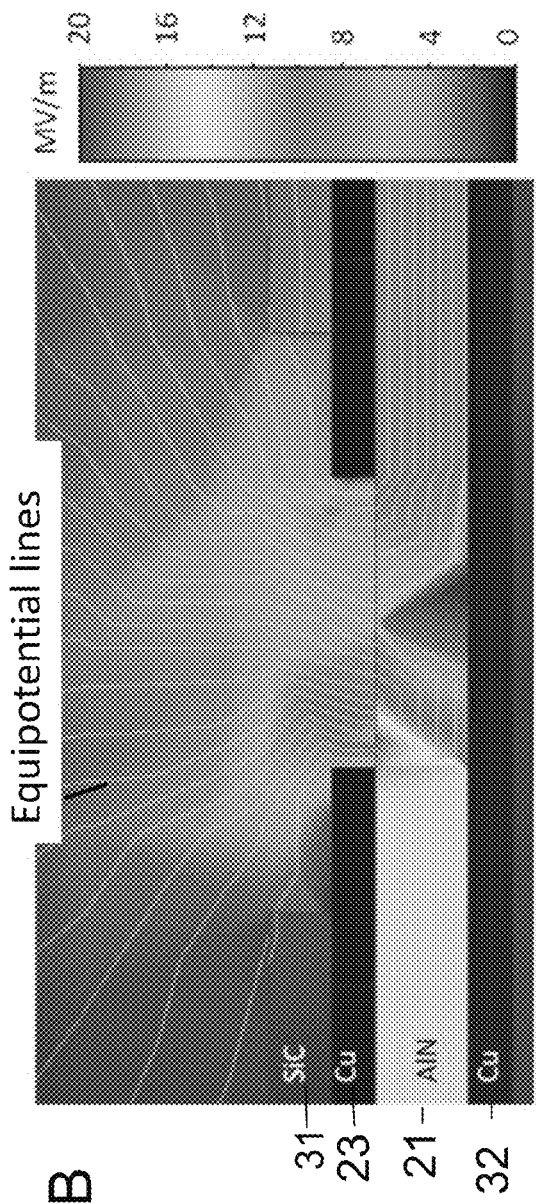
FIG. 8B shows a plot of the simulated electric field between two diode pads and in the plane of the cut-line A-A'.
Figure 9:
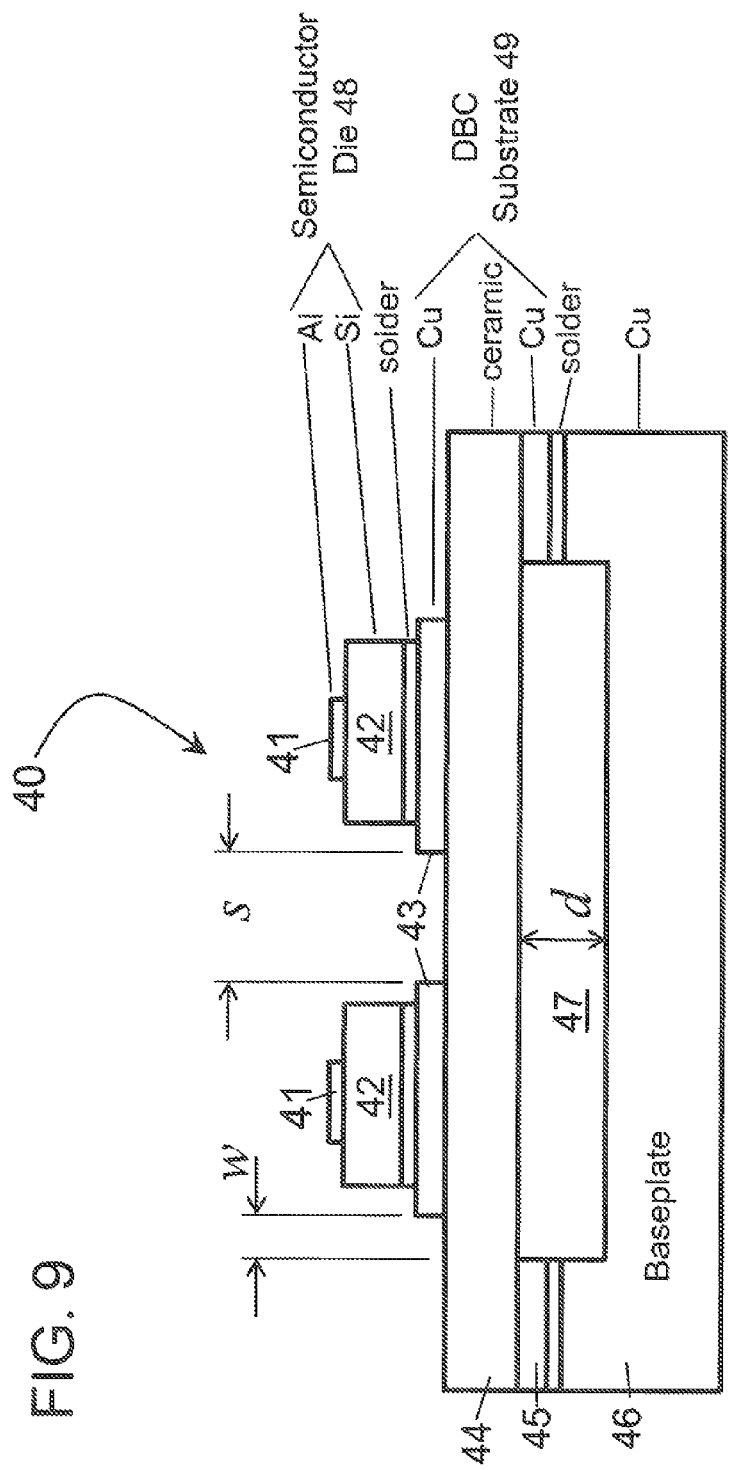
FIG. 9 is a cross section of new preferred embodiment HV DBC structure.

In order to adapt to much higher voltages (such as 15 kV), a goal is to minimize electric field intensities while maintaining thermal performance. Particular consideration must be given to the pad spacing with respect to other top-side pads as well as the bottom-side metallization. The electric field simulation software ElecNet, developed by Infolytica Corp., was used to evaluate and optimize package geometries for the FBR. FIGS. 8A and 8B show finite element analysis results for the potential and electric field of the planer FBR of FIGS. 4 and 5. This simulation used a 0.63 mm thick aluminum nitride (AlN) layer and an applied DC voltage of 15 kV. Note that the baseplate potential was not fixed and it assumed a value of approximately 9.4 kV. FIG. 8A shows the applied voltages on the top substrate metallizations and terminals—the red regions are at 15 kV and the blue regions are at 0 V; this represents a particular state of the FBR found in normal operation. FIG. 8B shows a plot of the simulated electric field between two diode pads and in the plane of the cut-line B-B'. Because the base plate potential is not exactly half of the applied voltage, the electric field in the AlN layer is not the same at each die location. The highest fields are observed under the 0 V metallizations and are approximately 15 MV/m. This is roughly two times that needed for the onset of PD in standard DBC substrates and, again, indicates a reliability concern. To reduce the electric fields within the AlN substrate, a pocket is cut in the base plate, and the bottom DBC layer be patterned as shown in FIG. 9. The pocket depth (d), pad margin (w), and pad spacing (s) can then be adjusted to reduce electric field intensities.

The preferred embodiment 40 illustrated in FIG. 9 comprises semiconductor dies 48 comprising anodes 41 and silicon or silicon carbide layers 42. The semiconductor dies 48 may be soldered to the DBC substrate 49 as shown in FIG. 9. The direct bonded copper (DBC) substrate 49 comprises copper layers 43, ceramic layer 44 and copper layer 45, having a portion of the pocket region 47 removed therefrom. The ceramic layer 44 may be, for example, aluminum nitride (AlN) or aluminum oxide. The pocket region 47 may be filled with a dielectric such as ambient gas such as air, a liquid such as mineral oil, or a solid such as silicone. The copper layer 45 may be soldered to the baseplate 46 as shown in FIG. 9.

Figure 10:
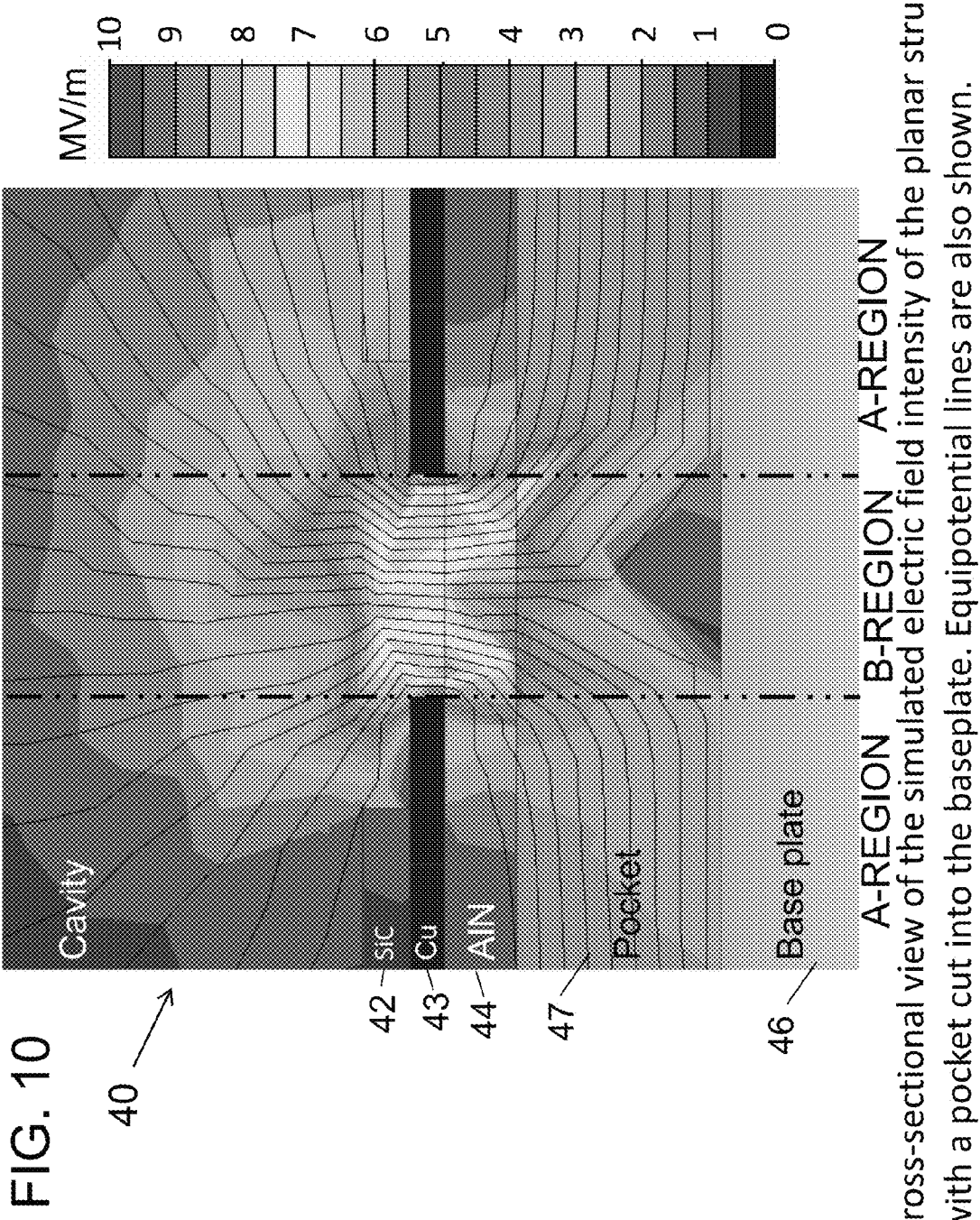
FIG. 10 is a cross-sectional view of the simulated electric field intensity of the planar structure with a pocket cut into the baseplate. Equipotential lines are also shown.
Figure 11:
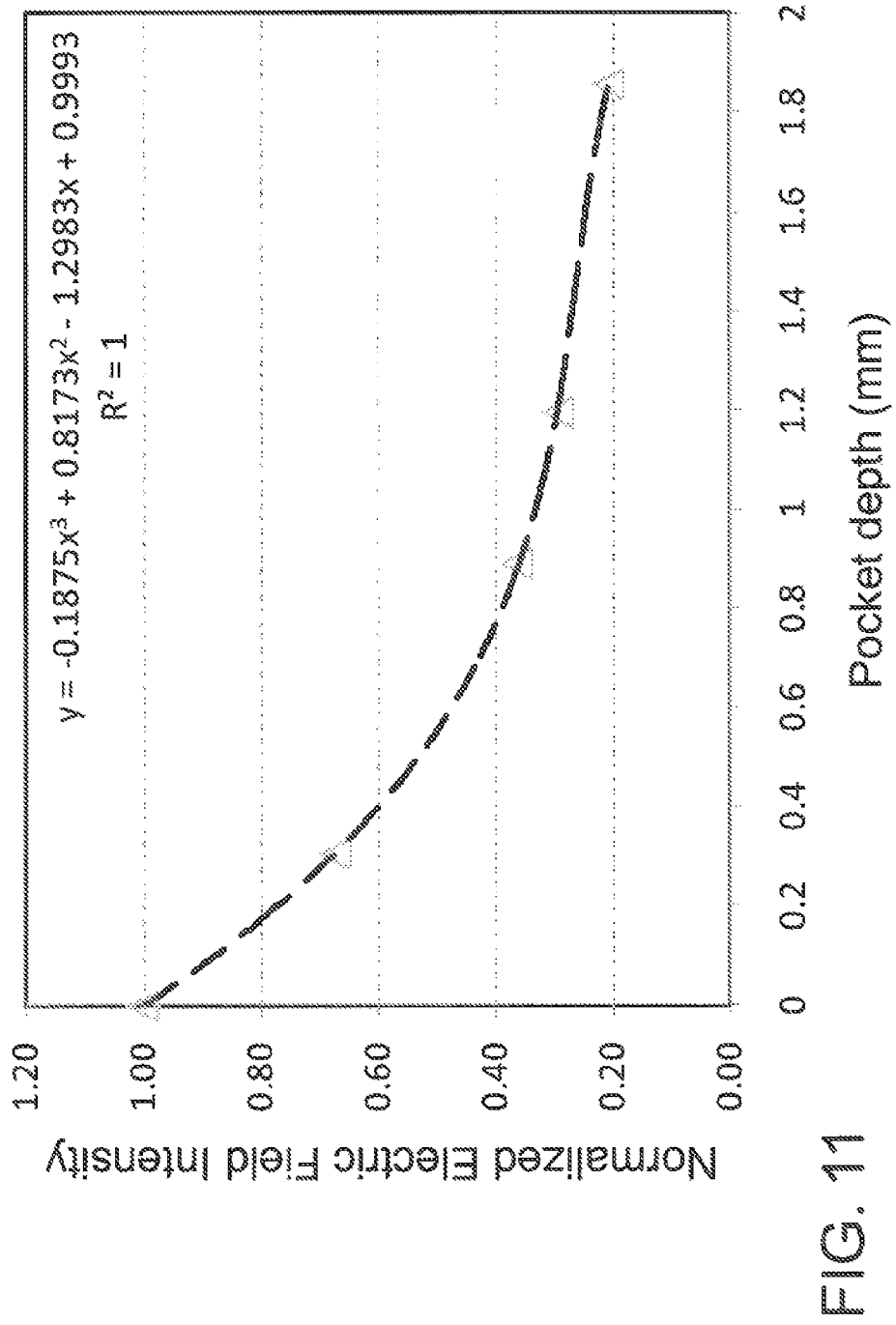
FIG. 11 is a graphical illustration of maximum electric field intensity within the aluminum nitride substrate in the B-region as a function of pocket depth (d).
Figure 12:
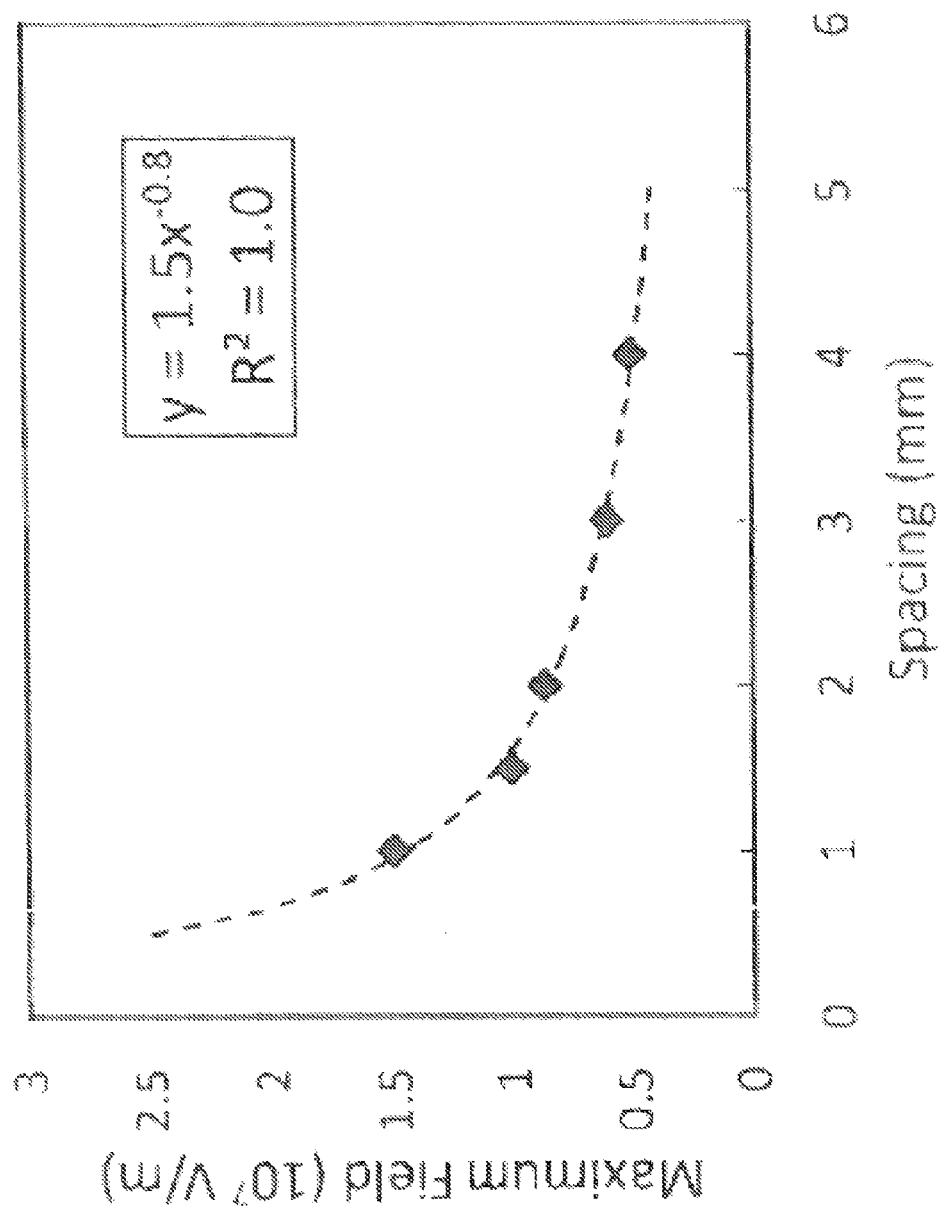
FIG. 12 shows the dependence of electric field intensity within the AlN layer as the spacing s (see FIG. 9) is varied from 0.5 to 4 mm with an applied potential difference of 15 kV

FIG. 10 shows the electric field plot resulting from the improved structure. In this case, d=1.8 mm (height of pocket region 47) and w=s=2 mm. As shown in FIG. 9 "w" is the spacing between a line extending vertically from pocket 47 to the edge of copper layer 43. The spacing "s" is the spacing between the layers 43. There are two regions of primary interest in this geometry: regions directly under the diode mounting pads ("A" regions) and the inter-diode regions where there is no top metallization ("B" regions), as depicted in FIG. 10. The maximum electric field in the A regions is approximately 1.2 MV/m (a 92% reduction over the solid base plate case) and is well below the PD onset threshold of 7 MV/m. In the B region, the maximum field intensity is approximately 8 MV/m. As the pocket depth is increased, the electric field intensity in the B regions decrease as shown in FIG. 10. In this example, increasing the pocket depth more than 1 mm does not significantly reduce the electric field in these regions. The electric field intensity in the B regions is a strong function of the lateral separation and potential of the top metallization pads. This leads to a design trade-off between overall package size and component reliability. For the example design, FIG. 12 shows the dependence of electric field intensity within the AlN layer as s is varied from 0.5 to 4 mm with an applied potential difference of 15 kV. By increasing the pad spacing to >3 mm, one can operate below the PD threshold. Once again, in order to adapt to much higher voltages (such as 15 kV), a goal is to minimize electric field intensities while maintaining thermal performance.

For a viable structure, several performance criteria must also be met. The first is that the thermal performance of the planar structure not be significantly degraded by the addition of the pocket. Based on the operating characteristics of the application circuit, we estimate that each diode in the bridge rectifier will dissipate an average power of 8 W. Three-dimensional thermal simulations were performed using Solid-Works® Flow Simulation by Dassault Systèmes SolidWorks Corp. using the simplified model of FIG. 9 and accepted materials properties.

Figure 6:
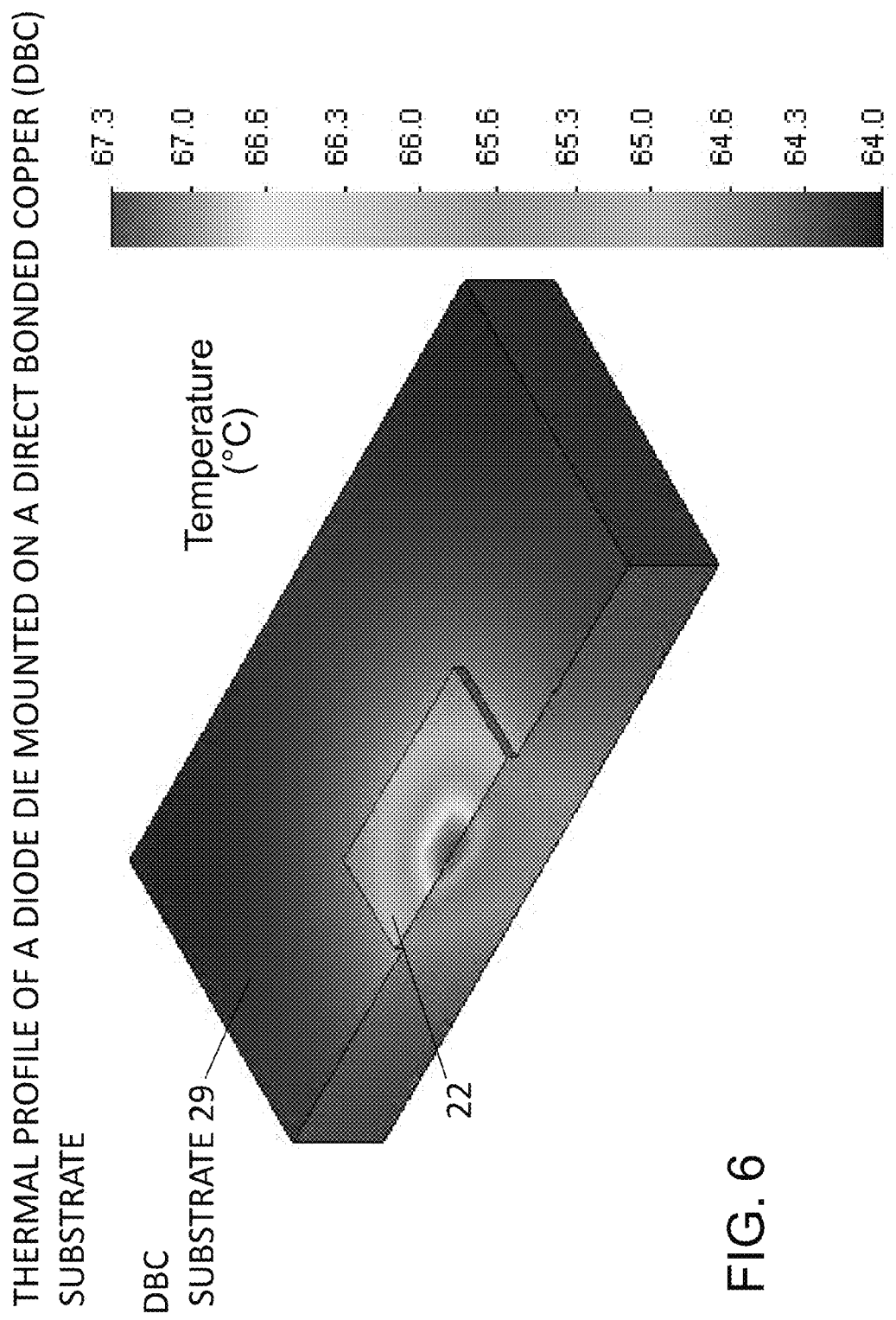
FIG. 6 shows the simulated die temperature of a planer DBC structure using the same material and loss parameters of the conventional package simulation.
Figure 13:
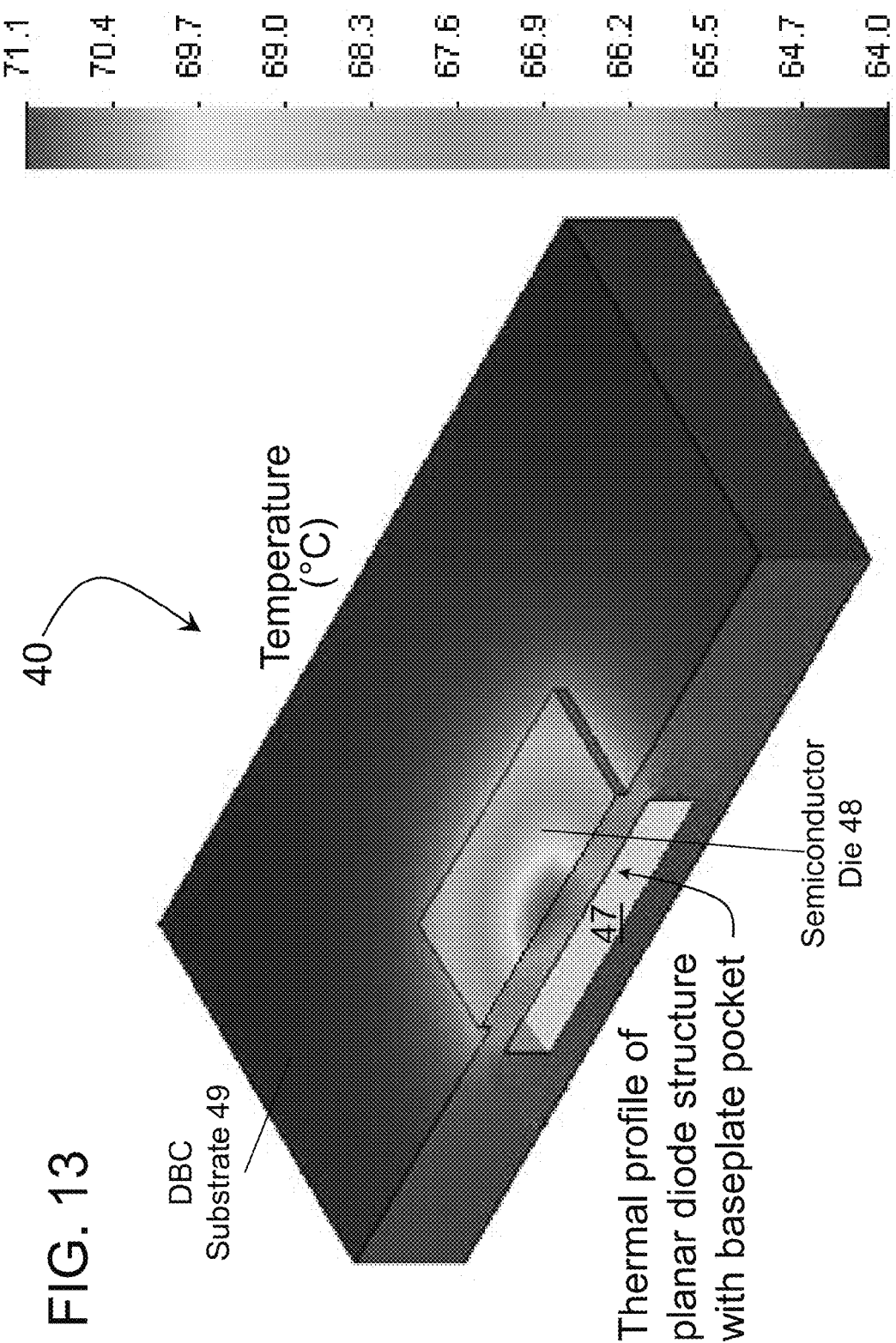
FIG. 13 is an illustration of a thermal profile of planar diode structure with baseplate pocket showing the calculated thermal profile of the pocket structure (d=1.8 mm) with an ambient temperature of 20° C. and base plate heat transfer coefficient of 200 W/m²/K.

FIG. 13 shows the calculated thermal profile of the pocket structure (d=1.8 mm) with an ambient temperature of 20° C. and base plate heat transfer coefficient of 200 W/m²/K. The maximum steady-state diode temperature is approximately 71° C. with a base plate temperature of 64° C. A similar analysis with d=0 mm resulted in a maximum steady-state diode temperature of approximately 67° C. and a base plate temperature of 64° C. Because the dissipated power and heat transfer coefficient are the same in both simulations, we expect that the base plate temperature should also be equal. Although the operating characteristics of the SiC diodes are temperature-dependent, these devices are able to operate up to 200° C. In our application, the predicted 4° C. additional increase in die temperature (approximately 67° C. in FIG. 6 versus approximately 71° C. in FIG. 13) will not significantly impact circuit performance.

A second requirement for viability is that internal mechanical stress developed by the mismatch of the coefficients of thermal expansion of the substrate and base plate materials must be minimized to avoid mechanical failure. This is especially true in the present design because the substrate above the pocket is not fully confined by solder. Before assembly, a series of thermal cycling experiments were performed on patterned and unpatterned substrates and machined base plates. These articles were subjected to the full thermal profile to determine if any deformation would occur—none was observed. These components were then bonded together, and the substrate exhibited an outward bow of approximately 0.4 mm across its width of 38 mm. This amount of deflection has not caused failures thus far; however, we plan to investigate baseplate materials, such as aluminum silicon carbide and lower temperature solders, to reduce mechanical stress in the system.

Figure 14:
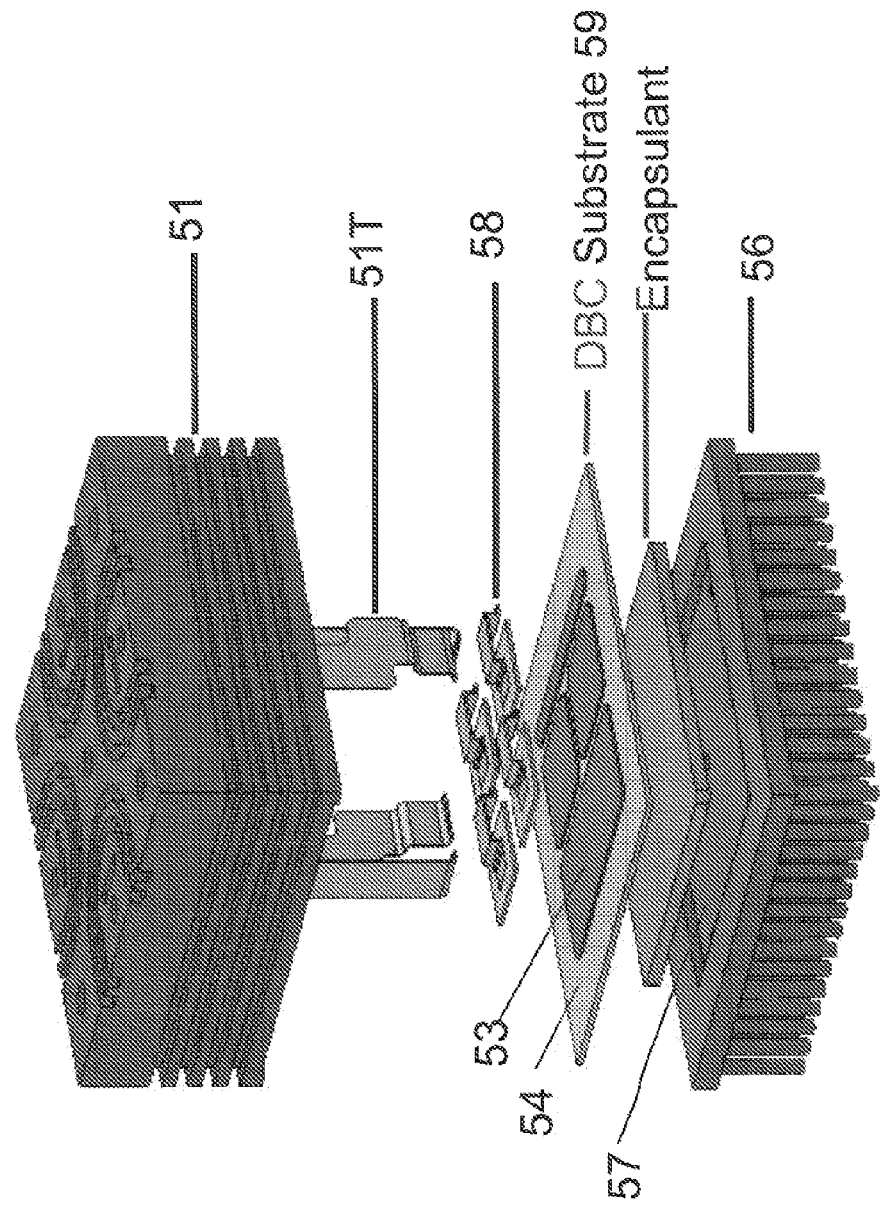
FIG. 14 is an exploded-view illustration of a 15-kV FBR module.
Figure 15A:
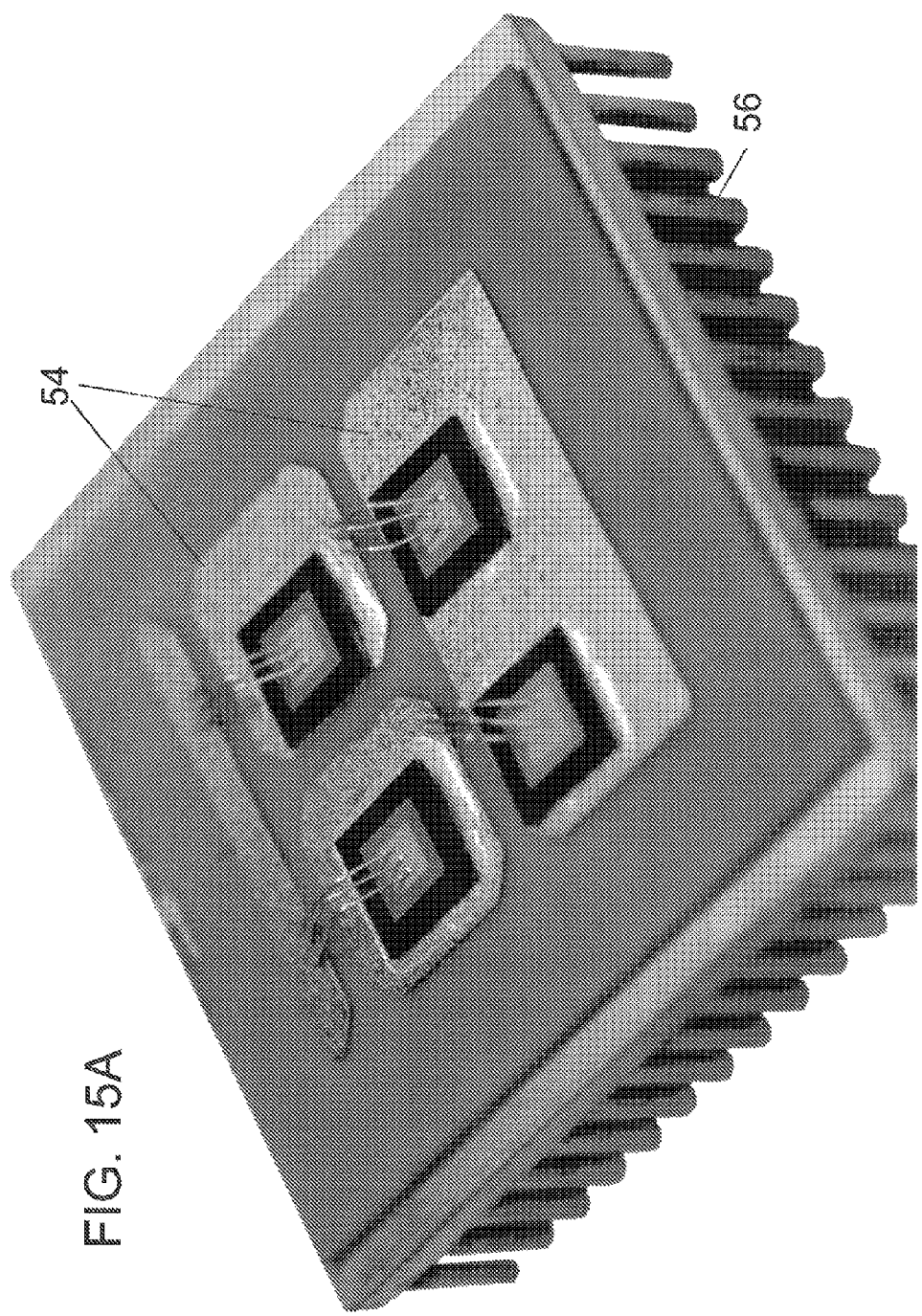
FIG. 15A is an illustration a preferred embodiment 15-kV planar FBR die and substrate bonded to the heat sink.

An exploded view of the 15 kV FBR module 50 is shown in FIG. 14, and a photograph of a completed module 50 is shown in FIG. 15B. Module 50 comprises a case 51, terminals 51T, and diodes 58. The module 50 was fabricated using a multi-step process. Curamik Electronics DBC substrate 59 material (0.3 mm Cu/0.6 mm AlN/0.3 mm Cu), was patterned to meet electrostatic simulation criteria and to accommodate devices, bond wires, and terminals on the top side, and the dielectric pocket 57 and heat sink interface on the bottom side. A minimum DBC copper pad 53 spacing of 2 mm was used (depicted horizontally in FIG. 14), and all pad corners were chamfered to reduce localized voltage stresses. Ceramic layer 54 is also shown in FIG. 14. The base plate 56 is a modified Cool Innovations Inc. (part number 4-202005U) copper pin fin heat sink. A 1.3 mm deep pocket was cut into the top face of the heat sink to provide most of the pocket 57 depth below the DBC substrate 59. The remaining 0.5 mm pocket depth is contributed by the removed copper on the bottom side of the DBC substrate. A pattern of holes (not shown) may also be drilled through the heat sink to allow the pocket to be filled with encapsulant following module solder bonding. As depicted in FIG. 10, the electric field is greatest in the pocket volume at the substrate interface. A gas such as nitrogen, air, or sulfur hexafluoride could be used as the ambient environment and would give a range of dielectric strength of 3 to 7 MV/m. The pocket may also be filled with a silicone encapsulant to achieve a dielectric strength approaching 20 MV/m. In the prototype, the pocket 57 was coated and partially filled with Dow Corning, Sylgard® 527.

Solder bonding at the diode-to-substrate and substrate-to-heat sink interfaces may be performed using a single-step process in a vacuum reflow oven to achieve low voiding-within the solder. A Sn—Ag—Cu alloy solder may be used on both interfaces, and the process temperature profile may be tailored to reduce mechanical stress in the final assembly. After the die, substrate, and heat sink are bonded, the die interconnects may be made using 0.25 mm diameter aluminum bond wires. Finally, four terminals 61 (which may be copper) may be attached to the substrate using a Sn—Pb alloy solder.

A plastic case 51 may also be utilized which may be constructed from polysulfone having a maximum working temperature of 160° C. In addition to its high temperature rating, this material has a voltage breakdown rating in excess of 20 MV/m and low moisture absorption. The height of the case 51 and terminal locations was specified to provide sufficient separation of all conductors, including the heat sink, to prevent voltage breakdown in air. Grooves were machined into the outside surfaces of the case to mitigate voltage creep. The case was attached to the substrate assembly using room-temperature vulcanizing silicone. Because the module was designed to have the heat sink at a floating potential, the case has four threaded holes for module mounting. Similar to the heat sink, a hole was placed in the top of the case to allow approximately three-quarters of the die cavity to be filled with an encapsulant, Sylgard® 527. This product was chosen because other encapsulants, with high curing temperatures, entrapped many voids. The remainder of the cavity was filled with Duralco™ 4537N epoxy to bind the terminals. The encapsulant was cured under a partial vacuum. Both the encapsulant and epoxy were cured at 27° C.

To baseline the module's HV performance, a "mock" module was fabricated using all components except diode die and bond wires. The module was biased, as shown in the inset in FIG. 16, to quantify leakage current and/or elicit dielectric breakdown of the packaging materials. The inset of FIG. 16 shows the biasing circuit. Both AC (60 Hz) and DC voltage sources were used to bias the module up to a peak voltage of 15 kV. The 88-MP resistor protected the ammeter from an overvoltage condition in the event of dielectric breakdown. The leakage current results are shown in FIG. 16 for an ambient temperature of 27° C. Note that dielectric breakdown was not observed during these tests. The DC characterization indicates an equivalent resistance of $2\times10^{12}\Omega$, whereas the AC data indicates a resistance of $3\times10^{8}\Omega$. The current response under AC stimulus is dominated by parasitic capacitances, and these results are consistent with the measured capacitance of 6 pF. Based on this data, the parasitic leakage current of the package is of the same order of magnitude as the diode reverse leakage current at 15 kV and will have negligible impact on system performance.

Figures 17A, 17B:
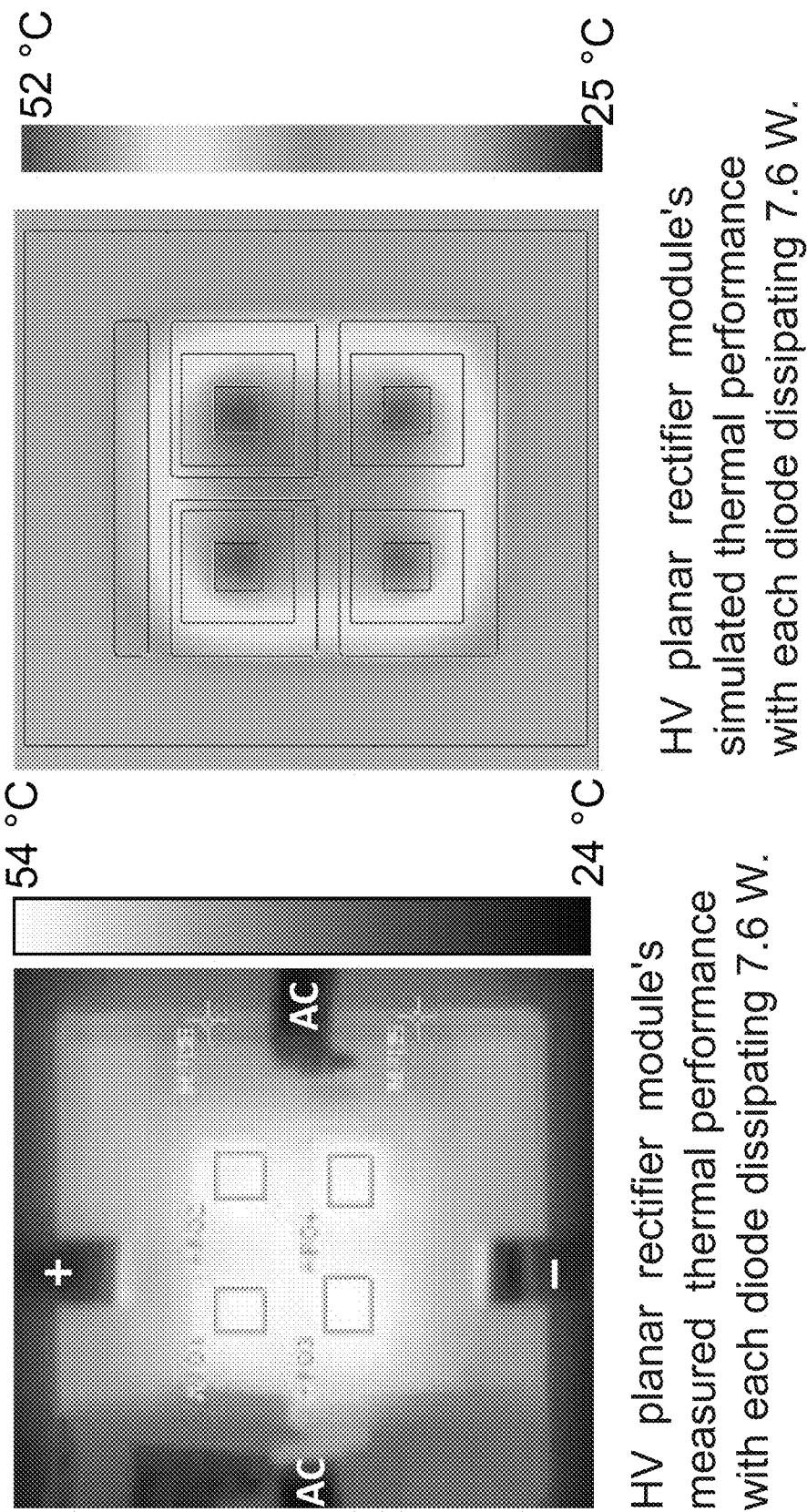
FIG. 17A illustrates the HV planar rectifier module's measured thermal performance with each diode dissipating 7.6 W.
FIG. 17B illustrates the simulated thermal performance of the HV planar rectifier module of FIG. 17A with each diode dissipating 7.6 W.

As a verification of the thermal modeling results for the proposed planar packaging technology, partially functional diodes were used in a heat sink-substrate assembly. The AC terminals of the module were connected to a variable 60-Hz power source, and the DC terminals were connected to a 20 $\Omega$, 125-W resistor. As approximately 7.6 W of power was dissipated in each diode, their temperatures were monitored with a thermal imaging camera. FIG. 17A shows a thermal image of the diodes with a fan blowing 27° C. air, at approximately 0.2 m$^3$/min, through the heat sink's pins. The simulation results of FIG. 17B are in very good agreement with the measured performance, and both are superior to the conventional HV FBR.

The pocket depth and metallization spacing may be optimized to reduce electric field stress within the package. In some applications, heat removal performance may not be significantly degraded by adding the pocket to the baseplate. Various dielectric materials may be used to fill the pocket to mitigate voltage breakdown within this region. Mechanical stress in the substrate must be managed when fabricating large, unsupported spans (large-area pockets). Conventional fabrication techniques and materials may be used, thereby minimizing the cost of HV semiconductor packages.

A 15 kV, full-bridge rectifier (FBR) module was developed based on state-of-the-art silicon carbide JBS diodes. When a pocket is incorporated in the base plate, electric field intensities were reduced, thereby allowing conventional materials and planar construction techniques to be used at much higher voltages. High voltage breakdown was not observed after five minutes at 15 kV. At a power density of 12 W/cm$^2$, the thermal performance of the high-voltage module has not been significantly degraded relative to a package wherein a solid base plate is used.

Although various preferred embodiments of the present invention have been described herein in detail to provide for complete and clear disclosure, it will be appreciated by those skilled in the art, that variations may be made thereto without departing from the spirit of the invention.

The terminology "substrate" or "substrate region" as used in the following claims means an underlying layer; The terminology encompasses the primary or underlying material on which other materials are applied, mounted and/or attached. In the case of more than one substrate, the substrates may be arranged on top of one another or side-by-side. The term substrate or substrate region as used in the claims encompasses a base region or base plate.

As used herein, the terminology "semiconductor die" means, as used in the context of integrated circuits, a small block of semiconducting material, on which a given functional circuit is fabricated. For example, an integrated circuit or circuits may be produced in large batches on a single wafer of electronic-grade silicon (EGS) or other semiconductor (such as GaAs) through processes such as photolithography. The wafer is cut ("diced") into many pieces, each containing one copy of the circuit. Each of these pieces is called a die.

It should be emphasized that the above-described embodiments are merely possible examples of implementations. Many variations and modifications may be made to the above-described embodiments. All such modifications and variations are intended to be included herein within the scope of the disclosure and protected by the following claims. The invention has been described in detail with particular reference to certain preferred embodiments thereof, but it will be understood that variations and modifications can be effected within the spirit and scope of the invention.

What is claimed is:

1. An electronic device structure comprising:
   at least one access lead adapted to be connected to an electrical circuit;
   at least one substrate region;
   at least one semiconductor die positioned on the substrate region; the at least one semiconductor die being operatively connected to the at least one access lead;
   a dielectric region extending below the at least one semiconductor die; the dielectric region being formed by creating a cavity in the substrate;
   whereby the dielectric region operates to reduce electric field stresses produced by the at least one semiconductor die to thereby reduce the possibility of material failure and voltage breakdown.

2. The structure of claim 1 wherein the structure has a generally a polyhedral shape presenting a plurality of faces and substantially insulatingly surrounding the electronic device with the at least two access leads exposed for effecting the electrical connection.

3. The structure of claim 1 wherein the electronic device is a high voltage device operating at a voltage in the range of approximately 5 kV to 15 kV.

4. The structure of claim 1 wherein the at least one substrate region comprises one of a direct bonded copper, direct bonded aluminum, or direct plated copper substrate, and further comprises a baseplate.

5. The structure of claim 4 wherein the at least one semiconductor die comprises an anode and a semiconductor layer, the at least one semiconductor die being positioned on at least one direct bonded copper substrate, the at least one direct bonded copper substrate being positioned on the at least one baseplate, the at least one direct bonded copper substrate comprising at least one ceramic layer positioned substantially between two copper layers, the base plate and the direct bonded copper substrate having portions removed therefrom for creating the dielectric region, the dielectric region comprising one of air, nitrogen, argon, sulfur hexafluoride, octafluorocyclobutane, paraffinic petroleum oil, water, Fluorinert™, polyalphaolefin, epoxy or silicone, and wherein the ceramic region of the direct bonded copper substrate comprises one of aluminum nitride, aluminum oxide, silicon carbide or beryllium oxide.

6. The structure of claim 5 wherein dielectric region has a depth in the range of 0.4 to 2 mm, and the length and width of the dielectric region extend under each of the at least one semiconductor die.

7. The structure of claim 6 wherein the at least one semiconductor die comprises a plurality of semiconductor the and wherein the spacing between the at least one semiconductor die is in the range from approximately 0.5 to 10 mm.

8. The structure of claim 6 wherein the dielectric region comprises a gas, liquid or solid having a dielectric strength in the range of approximately 3 to 30 MV/m and wherein a portion of the dielectric region is configured by removing a portion of the base plate and the remaining portion of the dielectric region is configured by removing a portion of the copper from the direct bonded copper substrate.

9. The structure of claim 1 wherein the at least one semiconductor die comprise a plurality of semiconductor die and wherein the maximum electric field in the regions below the plurality of semiconductor die is substantially below the partial discharge threshold of 5 to 10 MV/m.

10. The structure of claim 9 wherein the maximum electric field in the regions below the plurality of semiconductor die is approximately 1 MV/m.

11. The structure of claim 1 wherein the at least one semiconductor die comprise a plurality of semiconductor die and wherein the maximum electric field in the regions below the-plurality of semiconductor die is substantially below the partial discharge threshold of 5 MV/m.

12. The structure of claim 9 wherein the maximum electric field in the regions between the plurality of semiconductor die is less than approximately 8 MV/m, and wherein as the depth of the dielectric region depth increases, the magnitude of the electric field in between the plurality of semiconductor die decreases.

13. A method of making an electronic device structure comprising:
provlding at least one substrate region;
providing at least one access lead adapted to be operatively connected to an electrical circuit;
providing at least one semiconductor die located on the at least one substrate region; the at least one semiconductor die being operatively connected to the at least one access lead;
removing a portion of the at least one substrate region to provide a dielectric region within the at least one substrate region extending below the at least one semiconductor die;
whereby the dielectric region operates to reduce electric field stresses produced by the at least one semiconductor die to thereby reduce the possibility of material failure and voltage breakdown.

14. The method of claim 13 wherein the wherein the at least one substrate region comprises one of a direct bonded copper, direct bonded aluminum, or direct plated copper substrate, and further comprises a base plate comprising a metallic material such that a capacitive effect is produced between the base plate and one of the direct bonded copper, direct bonded aluminum, or direct plated copper substrate, and wherein in the removing step a portion of the base region is removed to form the dielectric region to thereby increase the distance between the resultant base plate and one of the a direct bonded copper, direct bonded aluminum, or direct plated copper substrate in the area underneath the at least one semiconductor die while maintaining the mechanical strength in other areas.

15. The method of claim 13 wherein the at least one substrate region comprises a direct bonded substrate comprising two copper layers with a ceramic layer therebetween, and wherein a portion of one of the copper layers most distal from the semiconductor die is removed to form the dielectric region.

16. The method of claim 13 wherein the at least one semiconductor die comprise a plurality of semiconductor die and wherein the maximum electric field in the regions between the plurality of semiconductor die is less than approximately 8 MV/m, and wherein as the depth of the dielectric region depth increases, the magnitude of the electric field in between the plurality of semiconductor die decreases.

17. The method of claim 13 wherein the at least one semiconductor die comprise a plurality of semiconductor die and wherein the maximum electric field in the regions below the plurality of semiconductor die is substantially below the partial discharge threshold of 5 MV/m.

18. An electronic device comprising:
at least one access lead adapted to be connected to an electrical circuit;
at least one substrate;
at least one semiconductor die mounted on the substrate; the at least one semiconductor die being operatively connected to the at least one access lead;
at least one dielectric region; at least a portion of dielectric region being located adjacent to the at least one substrate, the dielectric region extending below the at least one semiconductor die;
whereby the dielectric region operates to reduce electric field stresses produced by the at least one semiconductor die to thereby reduce the possibility of material failure and voltage breakdown.

19. The electronic device of claim 18 wherein the maximum electric field in the regions between the at least one semiconductor die is less than approximately 8 MV/m, and wherein as the depth of the dielectric region increases, the magnitude of the electric field in between the plurality of semiconductor die decreases.

20. The electronic device of claim 18 wherein the dielectric region comprises a gas, liquid or solid having a dielectric strength in the range of approximately 3 to 30 MV/m.

* * * * *